United States Patent
Dirks et al.

(10) Patent No.: US 10,592,618 B2
(45) Date of Patent: Mar. 17, 2020

(54) METHODS AND APPARATUS FOR SIMULATING INTERACTION OF RADIATION WITH STRUCTURES, METROLOGY METHODS AND APPARATUS, DEVICE MANUFACTURING METHOD

(71) Applicant: ASML Netherlands B.V., Veldhoven (NL)

(72) Inventors: Remco Dirks, Deurne (NL); Markus Gerardus Martinus Maria Van Kraaij, Eindhoven (NL); Maxim Pisarenco, Son en Breugel (NL)

(73) Assignee: ASML Netherlands B.V., Veldhoven (NL)

( * ) Notice: Subject to any disclaimer, the term of this patent is extended or adjusted under 35 U.S.C. 154(b) by 385 days.

(21) Appl. No.: 15/209,290

(22) Filed: Jul. 13, 2016

(65) Prior Publication Data

US 2017/0017738 A1 Jan. 19, 2017

(30) Foreign Application Priority Data

Jul. 17, 2015 (EP) ..................................... 15177294

(51) Int. Cl.
*G06F 17/50* (2006.01)
*H01L 21/66* (2006.01)
(Continued)

(52) U.S. Cl.
CPC .......... *G06F 17/5009* (2013.01); *G03F 7/705* (2013.01); *G03F 7/70058* (2013.01);
(Continued)

(58) Field of Classification Search
CPC .. G06F 17/5009; G03F 7/70625; G03F 7/705; G03F 7/70058; H01L 21/3065; H01L 22/20; H01L 21/308
See application file for complete search history.

(56) References Cited

U.S. PATENT DOCUMENTS 5,963,329 A 10/1999 Conrad et al.
6,704,661 B1 3/2004 Opsal et al.
(Continued)

FOREIGN PATENT DOCUMENTS

JP 2006-511799 A 4/2006
JP 2008-042202 A 2/2008
(Continued)

OTHER PUBLICATIONS

Kraaij, Van, "Forward diffraction modelling: analysis and application to grating reconstruction," Technische Universiteit, DOI: 10.6100/IR702579, pp. 1-157 (2011) (Year: 2011).*
(Continued)

*Primary Examiner* — Rehana Perveen
*Assistant Examiner* — Steven W Crabb
(74) *Attorney, Agent, or Firm* — Sterne, Kessler, Goldstein & Fox P.L.L.C.

(57) ABSTRACT

Parameters of a structure (900) are measured by reconstruction from observed diffracted radiation. The method includes the steps: (a) defining a structure model to represent the structure in a two- or three-dimensional model space; (b) using the structure model to simulate interaction of radiation with the structure; and (c) repeating step (b) while varying parameters of the structure model. The structure model is divided into a series of slices (a-f) along at least a first dimension (Z) of the model space. By the division into slices, a sloping face (904, 906) of at least one sub-structure is approximated by a series of steps (904', 906') along at least a second dimension of the model space (X). The number of slices may vary dynamically as the parameters vary. The number of steps approximating said sloping face is maintained constant. Additional cuts (1302, 1304) are introduced, without introducing corresponding steps.

20 Claims, 13 Drawing Sheets

(51) Int. Cl.
*H01L 21/3065* (2006.01)
*H01L 21/308* (2006.01)
*G03F 7/20* (2006.01)

(52) U.S. Cl.
CPC ........ *G03F 7/70625* (2013.01); *H01L 21/308* (2013.01); *H01L 21/3065* (2013.01); *H01L 22/20* (2013.01)

(56) References Cited

U.S. PATENT DOCUMENTS

| | | | |
|---|---|---|---|
| 6,785,638 B2 * | 8/2004 | Niu | G01B 11/24 |
| | | | 702/120 |
| 7,145,664 B2 | 12/2006 | Opsal et al. | |
| 7,158,239 B2 | 1/2007 | Hazart | |
| 7,613,598 B2 | 11/2009 | Opsal et al. | |
| 7,643,666 B2 | 1/2010 | Setija et al. | |
| 7,860,686 B2 * | 12/2010 | Hazart | G01B 11/24 |
| | | | 356/237.1 |
| 7,916,927 B2 | 3/2011 | Cramer et al. | |
| 8,879,073 B2 | 11/2014 | Madsen et al. | |
| 2004/0210402 A1 | 10/2004 | Opsal et al. | |
| 2005/0200859 A1 | 9/2005 | Hazart | |
| 2005/0209816 A1 * | 9/2005 | Vuong | G01B 11/24 |
| | | | 702/167 |
| 2005/0274901 A1 * | 12/2005 | Fabrikant | G01N 21/21 |
| | | | 250/397 |
| 2011/0218789 A1 | 9/2011 | Van Beurden | |
| 2013/0066597 A1 | 3/2013 | Van Beurden | |
| 2013/0282343 A1 | 10/2013 | Brill et al. | |
| 2015/0046118 A1 * | 2/2015 | Pandev | H01L 22/12 |
| | | | 702/155 |

FOREIGN PATENT DOCUMENTS

| | | |
|---|---|---|
| JP | 2011-040772 A | 2/2011 |
| JP | 2013-200180 A | 10/2013 |
| JP | 2015-509591 A | 3/2015 |
| WO | WO 02/27288 A1 | 4/2002 |
| WO | WO 2011/048008 A1 | 4/2011 |
| WO | WO 2013/047047 A1 | 4/2013 |

OTHER PUBLICATIONS

International Search Report and Written Opinion of the International Search Authority directed to related International Patent Application No. PCT/EP2016/065258, dated Oct. 28, 2016; 11 pages.

International Preliminary Report on Patentability directed to related International Patent Application No. PCT/EP2016/065258, dated Jan. 23, 2018; 6 pages.

Japanese Notice of Reasons for Rejection with English-language translation attached directed to related Japanese patent application No. 2018-500796, dated Feb. 13, 2019; 16 pages.

* cited by examiner

METHODS AND APPARATUS FOR SIMULATING INTERACTION OF RADIATION WITH STRUCTURES, METROLOGY METHODS AND APPARATUS, DEVICE MANUFACTURING METHOD

FIELD

The present invention relates to methods and apparatus for simulating interaction of radiation with structures. The invention may be applied for example in metrology of microscopic structures, for example to assess and improve performance of a lithographic apparatus. The radiation in that case may be electromagnetic radiation of any desired wavelength.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer).

In lithographic processes, it is desirable frequently to make measurements of the structures created, e.g., for process control and verification. Various tools for making such measurements are known, including scanning electron microscopes (SEM), which are often used to measure critical dimension (CD). Other specialized tools are used to measure parameters related to asymmetry. One of these parameters is overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" of one form or another. The term "spectrum" in this context will be used with a wide scope. It may refer to a spectrum of different wavelengths (colors), it may refer to a spectrum of different directions (diffraction angles), different polarizations, or a combination of any or all of these. From this spectrum a property of interest of the target can be determined. Determination of the property of interest may be performed by various techniques. One particular approach is to perform reconstruction of the target structure by iterative calculations. A mathematical model of the target is created and calculations are performed to simulate interaction of radiation with the target. Parameters of the model are adjusted and calculations repeated until the simulated spectrum becomes the same as the observed spectrum. The adjusted parameter values then serve as a measurement of the real target structure. Each updated model represents a point in "parameter space", which is a mathematical space with as many dimensions as there are parameters in the model. The aim of the iterative process is to converge to a point in parameter space that represents, at least approximately, the parameters of the actual target structure.

Compared with SEM techniques, optical scatterometers can be used with much higher throughput, on a large proportion or even all of the product units. The optical measurements can be performed very quickly. On the other hand, reconstruction requires a great deal of computation. New processes and target designs can create problems in that known iterative calculations may take a long time to converge on a solution, or may fail to converge.

In some reconstruction techniques, the mathematical model of the target structure is divided into slices, and propagation of radiation is simulated slice-by-slice to arrive at a predicted spectrum. Sloping features are approximated by a staircase in this sliced model. Known reconstruction methods use adaptive slicing as parameters vary. The aim of this is to ensure that the best approximation to the true shape is used at each iteration, without unduly increasing the processing and storage burden. The inventors have recognized that some problems arising when reconstructing some modern designs have a root cause related to this adaptive process.

Calculation methods for simulating interaction of radiation with different structures include for example rigorous coupled wave analysis or RCWA. RCWA is well-known and suitable for application to periodic structures. Other methods such as the differential method and the volume integral method are also known. These other methods are described, for example in the following patent applications: US 2011/218789 A1, WO 2011/48008 A1 and US 2013/066597 A1. The techniques disclosed herein are in no way limited in application to these types of calculations.

SUMMARY OF THE INVENTION

The inventors have recognized that, with known adaptive methods of slicing of target structures, smooth changes in a parameter can cause step changes (discontinuities) in responses of the model under simulation. These discontinuities can disrupt control of the iterative process, causing failure to converge in some cases, or convergence on a false solution. The inventors have devised modified rules for slicing to reduce the occurrence of these step changes.

The invention in a first aspect provides a method of determining parameters of a structure, the structure comprising a plurality of sub-structures, the method including the steps of:
(a) defining a structure model to represent the structure in a two- or three-dimensional model space;
(b) using the structure model to simulate interaction of radiation with the structure; and
(c) repeating step (b) while varying parameters of the structure model,
wherein for the performance of step (b) the structure model is divided into a series of slices along at least a first dimension of the model space,
wherein, by the division into slices, a sloping face of at least one sub-structure is approximated by a series of steps along at least a second dimension of the model space,
and wherein the number of steps approximating said sloping face is maintained constant between repeats of step (b) while the number of slices varies.

The method can be used as part of a metrology method, using the simulated interactions for reconstruction of the structure. The simulation of interactions can be performed for example as an iterative process, comparing the results of each iteration with an interaction already observed on the structure under investigation. The iterative process converges to a point in parameter space that serves as a measurement of the observed structure. The simulation of interactions can alternatively be performed in advance of the observations, for example to generate a library of simulated results for many different points in the parameter space. A measurement of a structure under investigation is then obtained by comparing an observed interaction with the simulated interactions in the library, and identifying a best match.

In prior techniques, generally slicing is done according to some dynamic rule, and steps to approximate the sloping face are applied at each slice boundary. Sometimes this results in a step change in the shape approximation, for a smooth change in a parameter. This introduces discontinuities in the response of the simulated interaction, which are identified as troublesome for reconstruction and other uses. By maintaining a constant number of steps to approximate a sloping face, the method enables a constant shape approximation. Consequently the discontinuities mentioned above can be eliminated or at least avoided or reduced.

Some embodiments disclosed herein use electromagnetic radiation for the measurement of microstructures made by lithographic processes. The disclosure is not limited to such structures. The disclosure is not limited to using electromagnetic radiation. The radiation in other applications may be for example acoustic radiation.

In embodiments of the method, within each series of steps the extent of each step in the first dimension varies smoothly with variation of said parameters in step (c). Different techniques to achieve this are described below, along with many other embodiments.

In some embodiments, the first dimension is a height direction relative to a substrate on which the structure is formed. The invention is not limited to such structures, nor to any particular coordinate frame. The method may include slicing in more than one dimension.

The invention in a second aspect provides a processing apparatus for use in determining parameters of a structure, the structure comprising a plurality of sub-structures, the apparatus comprising a processor arranged to perform the steps of:
(a) defining a structure model to represent the structure in a two- or three-dimensional model space;
(b) using the structure model to simulate interaction of radiation with the structure; and
(c) repeating step (b) while varying parameters of the structure model,
wherein for the performance of step (b) the processor is arranged to divide the structure model into a series of slices along at least a first dimension of the model space,
wherein, by the division into slices, a sloping face of at least one sub-structure is approximated by a series of steps along at least a second dimension of the model space, and
and wherein the processor is arranged to maintain the number of steps approximating said sloping face constant between repeats of step (b) while the number of slices varies.

The invention in a third aspect provides metrology apparatus for use in determining parameters of a structure, the metrology apparatus comprising: an irradiation system for generating a beam of radiation; a substrate support operable with the irradiation system for irradiating a structure formed on the substrate with radiation;
a detection system for detecting radiation after interaction with the structure; and
a processing apparatus according to the second aspect of the invention as set forth above, arranged to simulate interaction of radiation with the structure and to compare the detected radiation with a result of the simulated interaction.

The processing apparatus may be provided for performing the method according to the invention as set forth above. The processing apparatus and/or method may be implemented by running a suitable program of instructions on a computer. The instructions may form a computer program product. The instructions may be stored in a non-transitory storage medium.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

Embodiments of the invention will now be described, by way of example, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Lithographic Manufacturing Background

Figure 1:
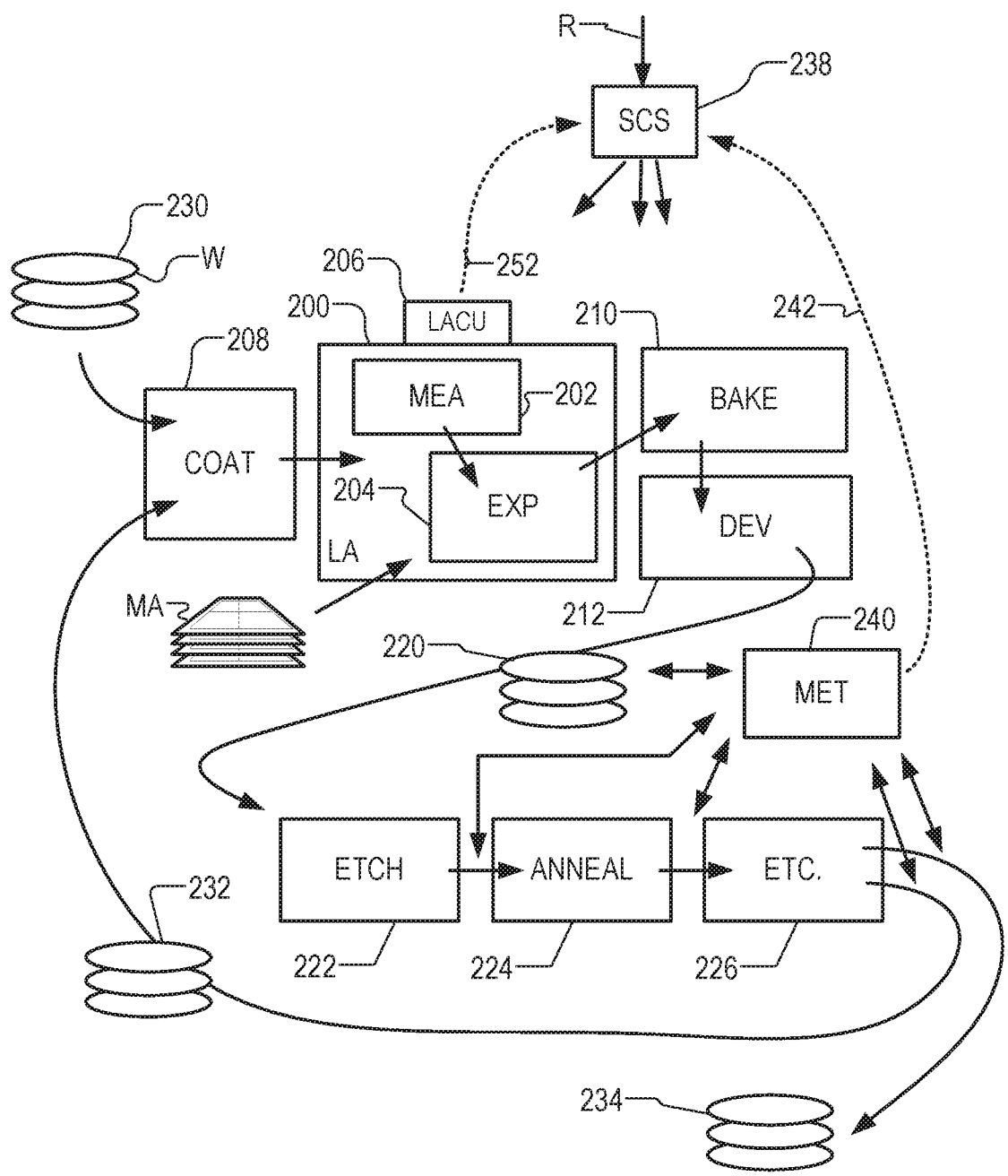
FIG. 1 depicts a lithographic apparatus together with other apparatuses forming a production facility for semiconductor devices.

FIG. 1 at 200 shows a lithographic apparatus LA as part of an industrial facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables WTa and WTb and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system (SCS) 238. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

Figure 2:
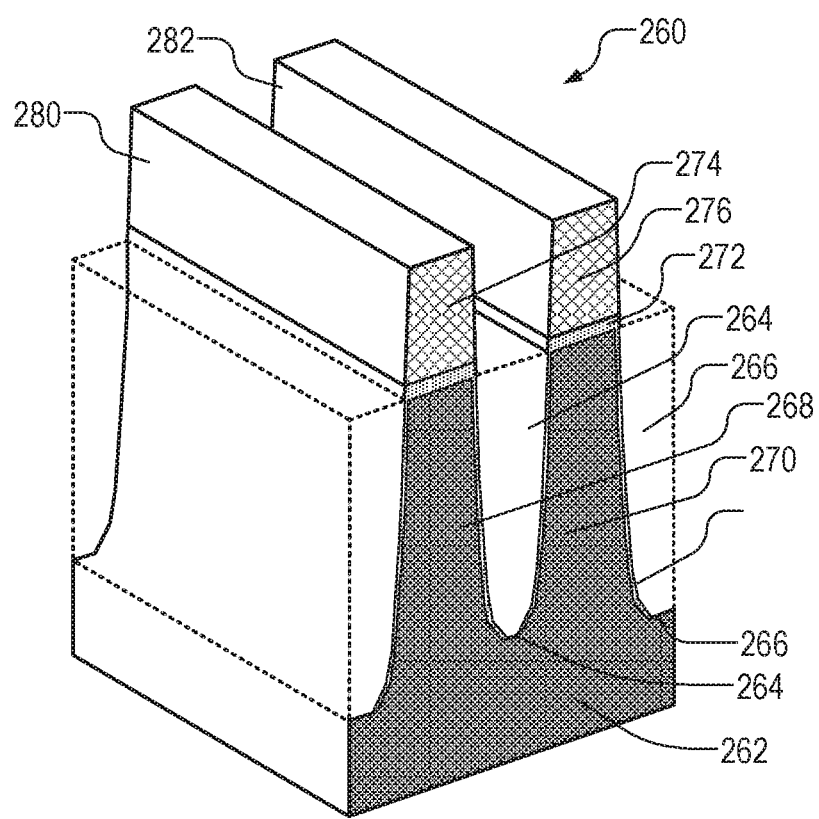
FIG. 2 is a schematic cross-section of an example of a target structure formed by a double patterning process.

FIG. 2 shows a portion of a structure 260 manufactured by a sequence of lithographic steps in a production facility such as that shown in FIG. 1. The structure is presented purely by way of example of the type of target structure that may need to be measured using metrology apparatus 240 and its associated data processing. The structure may be for example a stage in the production of a finFET device, and may be made by double patterning techniques. It will be understood that this portion is part of an array of such structures formed over an area of a substrate (W in FIG. 1). The array of structures will often be periodic in at least one direction. It may be periodic in only the X direction (as labelled), while extending notionally in the Y direction. The illustrated portion is only one repeating unit of this periodic array. Provided the array extends beyond the field of view of the metrology apparatus it can be regarded as infinite for the purposes of the reconstruction process. These properties of periodicity, when present, can be exploited to simplify the calculations. The techniques of the present disclosure are in no way limited to such periodic structures, however, nor to any particular method of calculation.

In the example target structure 260, substrate material 262 has been processed as described above to form various sub-structures within and on top of the substrate. As examples of such sub-structures, trenches 264 and 266 have been formed. Lower fin structures 268 and 270 of substrate material remain between the trenches. The lower fin structures are coated on their sides and tops with another material 272 (for example a gate oxide material). Upper fin structures 274 and 276 are formed on top of the lower fin structures and coating. The upper fin structures may be made of for example a hard mask material.

In a theoretical manufacturing process, all of the mentioned sub-structures would have sizes and shapes exactly in accordance with a design. In a real manufacturing process, however, deviations from the ideal structure arise, and the metrology apparatus is used to measure the structures actually produced. In this way, deviations may be corrected, either in the design or in control of the lithographic process. Thus, in the target structure illustrated in FIG. 2, the side walls of the various sub-structures may not be perfectly vertical, but may have sloping and/or curved sides, as shown. Sub-structures may not be perfectly symmetrical. Coating 272 may not have a uniform thickness. In an ideal product, sub-structures formed in different stages of a multiple patterning process will have identical forms and heights. In practice they may not be perfectly identical. Thus, for example, side walls 280, 282, of the upper fin structures may have non-vertical slopes. The bottom 284 of trench 264 may be less deep than the bottom 286 of trench 266. One fin structure may be wider than another. The inventors have found that these artifacts in this type of structure introduce particular problems under existing methods of reconstruction. The problems are not limited to multiple patterning processes. Many modern devices are produced by assembling a more complicated shape out of more basic shapes using a sequence of many processing steps. In such processes, deviations in one or more process steps can cause one part of the structure to outgrow some other part, although they are designed to be identical.

Metrology Background

Figure 3:
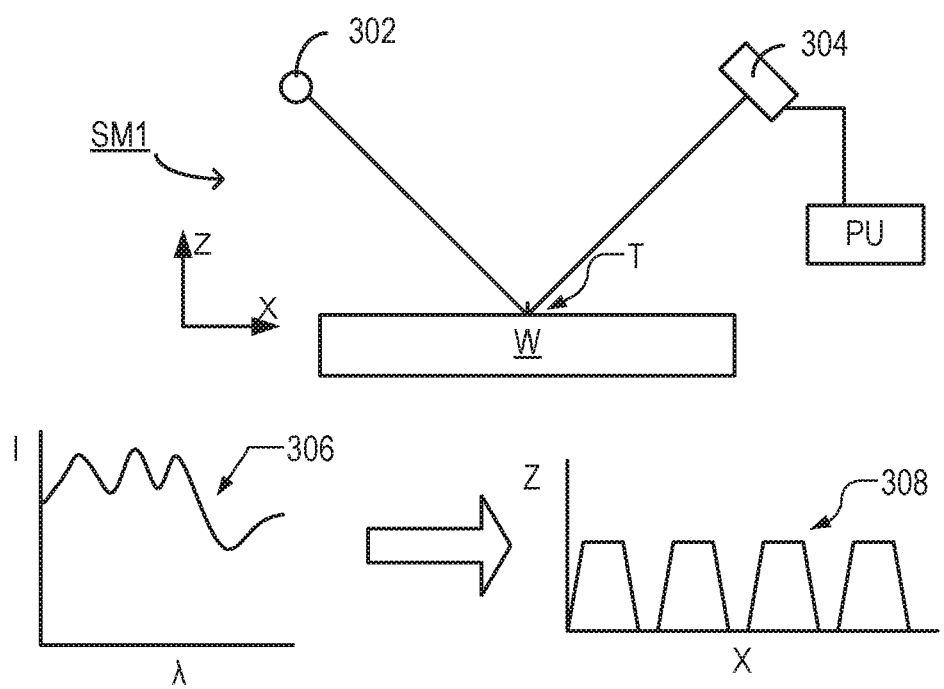
FIG. 3 depicts a first type of scatterometer that may be used in metrology methods according to embodiments of the invention.

FIG. 3 depicts a known spectroscopic scatterometer which may be used as a metrology apparatus in a system of the type described above. It comprises a broadband (white light) radiation projector 302 which projects radiation onto a substrate W. The reflected radiation is passed to a spectrometer 304, which measures a spectrum 306 (intensity as a function of wavelength) of the specular reflected radiation. From this data, the structure or profile 308 giving rise to the detected spectrum may be reconstructed by calculation within processing unit PU. The reconstruction can be performed for example by Rigorous Coupled Wave Analysis and non-linear regression, or comparison with a library of pre-measured spectra or pre-computed simulated spectra. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
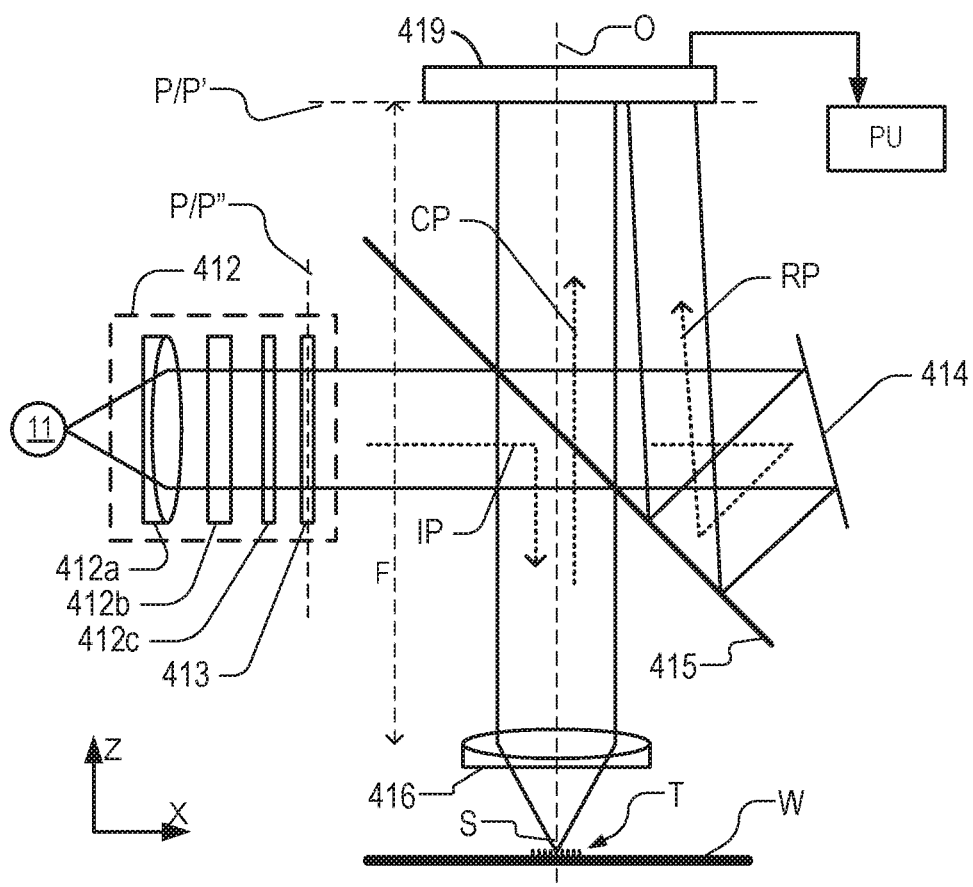
FIG. 4 depicts a second type of scatterometer that may be used in metrology methods according to embodiments of the invention.

FIG. 4 shows the basic elements of a known angle-resolved scatterometer that may be used instead of or in addition to a spectroscopic scatterometer. In this type of inspection apparatus, radiation emitted by a radiation source 411 is conditioned by an illumination system 412. For example, illumination system 412 may include a collimating using lens system 412a, a color filter 412b, a polarizer 412c and an aperture device 413. The conditioned radiation follows an illumination path IP, in which it is reflected by partially reflecting surface 415 and focused into a spot S on substrate W via a microscope objective lens 416. A metrology target structure T may be formed on substrate W. Lens 416, has a high numerical aperture (NA), preferably at least 0.9 and more preferably at least 0.95. Immersion fluid can be used to obtain with numerical apertures over 1 if desired.

As in the lithographic apparatus LA, one or more substrate tables may be provided to hold the substrate W during measurement operations. The substrate tables may be similar or identical in form to the substrate tables WTa, WTb of FIG. 1. (In an example where the inspection apparatus is integrated with the lithographic apparatus, they may even be the same substrate tables.) Coarse and fine positioners may be configured to accurately position the substrate in relation to a measurement optical system. Various sensors and actuators are provided for example to acquire the position of a target of interest, and to bring it into position under the objective lens 16. Typically many measurements will be made on targets at different locations across substrate W. The substrate support can be moved in X and Y directions to acquire different targets, and in the Z direction to obtain a desired focusing of the optical system on the target. It is convenient to think and describe operations as if the objective lens and optical system are being brought to different locations on the substrate, when in practice the optical system remains substantially stationary and only the substrate moves. In other examples, the substrate moves in one direction while the optical system moves in the other direction, to achieve overall X-Y movement. Provided the relative position of the substrate and the optical system is correct, it does not matter in principle whether one or both of those is moving in the real world.

When the radiation beam is incident on the beam splitter 416 part of it is transmitted through the beam splitter (partially reflecting surface 415) and follows a reference path RP towards a reference mirror 414.

Radiation reflected by the substrate, including radiation diffracted by any metrology target T, is collected by lens 416 and follows a collection path CP in which it passes through partially reflecting surface 415 into a detector 419. The detector may be located in the back-projected pupil plane P, which is at the focal length F of the lens 416. In practice, the pupil plane itself may be inaccessible, and may instead be re-imaged with auxiliary optics (not shown) onto the detector located in a so-called conjugate pupil plane P'. The detector may be a two-dimensional detector so that a two-dimensional angular scatter spectrum or diffraction spectrum of a target structure can be measured. In the pupil plane or conjugate pupil plane, the radial position of radiation defines the angle of incidence/departure of the radiation in the plane of focused spot S, and the angular position around an optical axis O defines azimuth angle of the radiation. The detector 419 may be, for example, an array of CCD or CMOS sensors, and may use an integration time of, for example, 40 milliseconds per frame.

Radiation in reference path RP is projected onto a different part of the same detector 419 or alternatively on to a different detector (not shown). A reference beam is often used for example to measure the intensity of the incident radiation, to allow normalization of the intensity values measured in the scatter spectrum.

It may be noticed that radiation is reflected by and later transmitted through partially reflecting surface 415 on its way from source 411 to detector 419. At each reflection or transmission, a substantial portion of the radiation is "lost" and cannot be used in the measurement. A portion of the lost radiation may be used for other purposes, for example to serve for focusing or alignment; or for the reference beam as described above.

The various components of illumination system 412 can be adjustable to implement different metrology 'recipes' within the same apparatus. Color filter 412b may be implemented for example by a set of interference filters to select different wavelengths of interest in the range of, say, 405-790 nm or even lower, such as 200-300 nm. An interference filter may be tunable rather than comprising a set of different filters. A grating could be used instead of interference filters. Polarizer 412c may be rotatable or swappable so as to implement different polarization states in the radiation spot S. Aperture device 413 can be adjusted to implement different illumination profiles. Aperture device 413 is located in a plane P''' conjugate with pupil plane P of objective lens 416 and the plane of the detector 419. In this way, an illumination profile defined by the aperture device defines the angular distribution of light incident on substrate radiation passing through different locations on aperture device 413.

The detector 419 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic-polarized light and transverse electric-polarized light. For finer resolution, EUV wavelengths can be considered for use in metrology apparatus, with appropriate modification of the source and optical system.

Where a metrology target T is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PS. Illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes. The techniques disclosed herein are not limited to inspection of grating structures, and any target structure, including a blank substrate or a substrate having only flat layers on it, is included within the term "target structure".

The target T in practice may be a structure more complicated than a simple grating. The target structure may be a product structure rather than a target formed specifically for metrology. The target structure may be of more than one layer, such as the double-patterned fin and trench structure of FIG. 2, for example.

Using one of the scatterometers described above in combination with modeling of a target structure such as the target T and its diffraction properties, measurement of the shape and other parameters of the structure can be performed in a number of ways. In a first type of process, represented by FIG. 5, a diffraction pattern based on a first estimate of the target shape (a first candidate structure) is calculated and compared with the observed diffraction pattern. Parameters of the model are then varied systematically and the diffraction re-calculated in a series of iterations, to generate new candidate structures and so arrive at a best fit. While some methods vary the parameters systematically, other techniques rely on sampling the parameter space in a random fashion. Examples of these are Markov Chain Monte-Carlo methods. Those techniques are not excluded from the present disclosure. In a second type of process, spectra for many different candidate structures are calculated in advance to create a 'library' of spectra. Then the spectrum observed from the measurement target is compared with the library of calculated spectra to find a best fit. Both methods can be used together: a coarse fit can be obtained from a library, followed by an iterative process to find a best fit. The methods to be described below relate to the method of simulating interaction between radiation and a structure, and can be applied in any of these types of process. The first type of process will be referred to, only for the sake of illustration.

Figure 5:
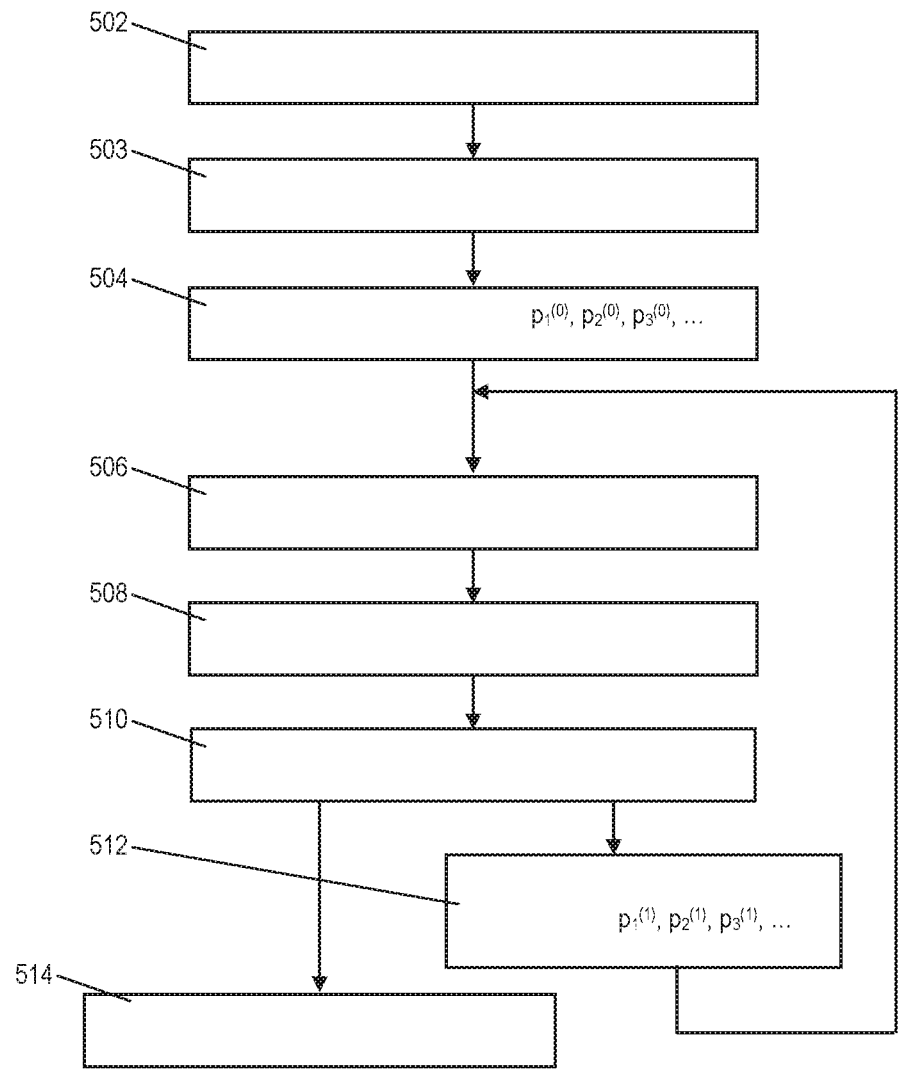
FIG. 5 depicts a first example process using an embodiment of the invention for reconstruction of a structure from scatterometer measurements.

Referring to FIG. 5 in more detail, the way the measurement of the target shape and/or material properties is carried out will be described in summary. The target may for example be a 1-dimensional (1-D) or 2-dimensional array of sub-structures on a substrate. The disclosure is not limited to arrays of sub-structures on a planar substrate, although that is typically the form of a semiconductor product. When referring to sub-structures "on" a substrate, the skilled reader will understand that the structure may include buried layers and buried features. Modern device structures can extend significantly in three dimensions.

For the following description, it will be assumed that the angle-resolved scatterometer of FIG. 4 is used. The scatter spectrum is a diffraction pattern at one or more wavelengths. The skilled person can readily adapt the teaching to different types of scatterometer, for example the spectroscopic scatterometer of FIG. 3, or even other types of measurement instrument.

In step 502, the diffraction pattern of the actual target on the substrate is measured using a scatterometer such as the one shown in FIG. 4. This measured diffraction pattern is forwarded to a calculation system such as a computer. The calculation system may be the processing unit PU referred to above, or it may be a separate apparatus.

In step 503, a 'model recipe' is established which defines a parameterized model of the target structure in terms of a number of parameters $p_i$ ($p_1$, $p_2$, $p_3$ and so on). These parameters may represent for example, in a 1-D periodic structure, the angle of a side wall, the height or depth of a feature, the width of the feature. Properties of the target material and underlying layers are also represented by parameters such as refractive index (at a particular wavelength present in the scatterometry radiation beam). Some of the underlying layers may include grating structures or other patterned structures. Importantly, while a target structure may be defined by dozens of parameters describing its shape and material properties, the model recipe will define many of these to have fixed values, while others are to be variable or 'floating' parameters for the purpose of the following process steps. For the purposes of describing FIG. 5, only the variable parameters are considered as parameters $p_i$.

In step 504: A model target shape is estimated by setting initial values $p_i(0)$ for the floating parameters (i.e. $p_1(0)$, $p_2(0)$, $p_3(0)$ and so on). Each floating parameter may be subject to constraints, as defined in the recipe. Some parameters will have a natural boundary constraint, for example in the case of a thickness that cannot be negative, or a linewidth that cannot be wider than a period in the case of a periodic structure.

In step 506, the parameters representing the estimated shape, together with the optical properties of the different elements of the model, are used to calculate the scattering properties, for example using a rigorous optical diffraction method such as RCWA or any other solver of Maxwell equations. Examples of suitable methods can be found in the literature, and in the patent applications listed in the introduction. This gives an estimated or model diffraction pattern of the estimated target shape.

In steps 508 and 510, the measured diffraction pattern and the model diffraction pattern are then compared and their similarities and differences are used to calculate a "merit function" for the model target shape. An aim of the method as a whole is to maximize the merit function by varying the parameters. Alternatively and equivalently, a "cost function" may be defined. Minimizing the cost function becomes the equivalent of maximizing a merit function.

In step 512, assuming that the merit function indicates that the model needs to be improved before it represents accurately the actual target shape, new parameters $p_1(1)$, $p_2(1)$, $p_3(1)$, etc. are estimated and fed back iteratively into step 506. Steps 506-512 are repeated.

In order to assist the search, the calculations in step 506 may further generate partial derivatives of the merit function, indicating the sensitivity with which increasing or decreasing a parameter will increase or decrease the merit function, in this particular region in the parameter space. The calculation of merit functions and the use of derivatives is generally known in the art, and will not be described here in detail.

In step 514, when the merit function indicates that this iterative process has converged to a solution with a desired accuracy, the currently estimated parameters are reported as the measurement of the actual target structure.

The computation time of this iterative process is partly determined by the forward diffraction model used, i.e. the calculation of the estimated model diffraction pattern using a rigorous optical diffraction theory from the estimated target structure. If more parameters are required, then the calculation of derivatives and merit functions becomes more onerous. A 3-dimensional structure requires more calculation than a 2-dimensional structure. Other design choices also influence the computational burden.

The estimated or model diffraction pattern calculated at 506 can be expressed in various forms. Comparisons are simplified if the calculated pattern is expressed in the same form as the measured pattern generated in step 510. For example, a modeled wavelength spectrum can be compared easily with a spectrum measured by the spectroscopic scatterometer of FIG. 3; a modeled pupil pattern can be compared easily with a pupil pattern measured by the apparatus of FIG. 4.

Target Model Slicing—Background

Figure 6:
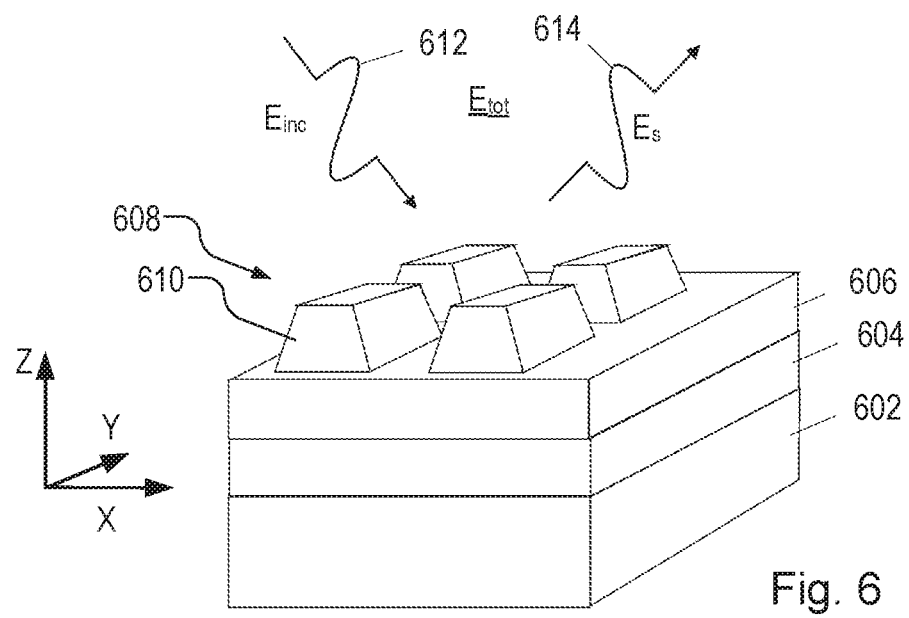
FIG. 6 depicts an example of a 2-dimensional grating structure on a substrate.

FIG. 6 illustrates schematically a simplified target structure that may be reconstructed using with the methods disclosed herein. A substrate 602 is the lower part of a medium layered in the z direction. Other layers 604 and 606 are shown. A two dimensional grating 608 that is periodic in X and Y is shown on top of the layered medium. The grating comprises an array of elements 610. An incident field 612 interacts with and is scattered by the structure 602 to 608 resulting in a scattered field 614. Thus the structure is periodic in at least one direction, X, Y, and includes materials of differing properties. This causes discontinuities in parts of an electromagnetic field, $E_{tot}$, that comprises a total of incident, $E_{inc}$, and scattered, $E_s$ electromagnetic field components at a material boundary between the differing materials.

Figure 7:
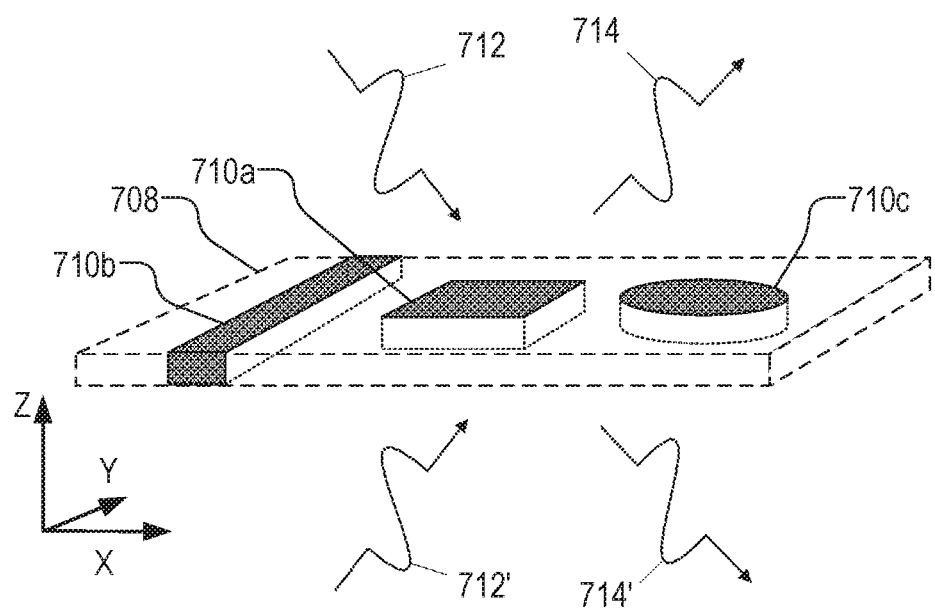
FIG. 7 illustrates the interaction of radiation with a slice of a structure model.

As shown in FIG. 7, when simulating interaction of radiation with a target structure using a mathematical model such as the ones shown in FIG. 2 or 7, the calculation can be simplified by dividing the model space into discrete slices, and modeling the interaction slice-by-slice. When the target structure is either periodic or infinite in the X and/or Y directions, slicing will normally be done in the Z direction, in which the target structure is not periodic. A slice 708 is shown which represents a thin cross-section of the target structure model. Within this slice, there are regions of two or more different material properties. A region 710*a* may form a slice of one of the sub-structures 610 of FIG. 6, for example. A region 710*b* may represent a slice of a grating bar or fin structure in a one-dimensional array. The cross-sections of sub-structures represented in a slice need not be linear or rectangular cross-sections. A region 710*c* shows that the sub-structures may be round or oval, such as contact holes or pillars. More elaborate shapes are possible.

The purpose of the slicing, however, is to represent a section of the model in which the cross-section is invariant in the slicing direction. The calculations of incident and scattered fields can be simplified in this way. For each slice, there are incident and scattered fields 712 and 714 at the upper side, and incident and scattered fields 712' and 714' at the lower side. These fields can be used as inputs and outputs of the slices above and below, until the interaction of radiation with the entire 2- or 3-dimensional structure has been calculated.

Although, in the illustrated examples, a first dimension along which slicing is performed is a direction (Z) normal to a plane of a substrate, this is only one possible choice. For other types of structures, slicing may performed along an X or Y direction, or any dimension of the 2- or 3-dimension space in which the model is defined. The model space need not be defined by Cartesian coordinates at all. It may be defined in spherical polar coordinates, or cylindrical polar coordinates, for example, to exploit some circular symmetry in the supposed target structure. In such a case, slicing may be performed along a radial dimension, so that each "slice" in fact has the form of a spherical or cylindrical shell. As will be illustrated below, slicing can be performed in more than one dimension.

Figure 8:
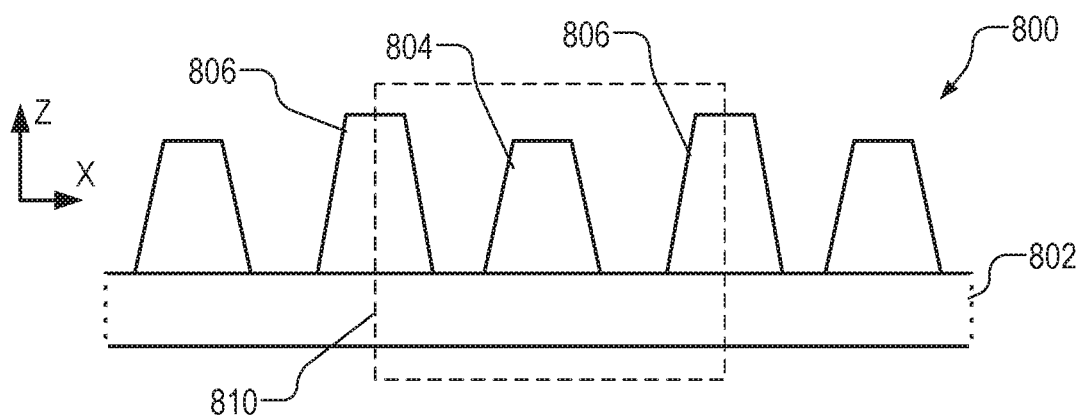
FIG. 8 is a schematic cross section of a structure model for a simplified target structure made by a double-patterning process.

FIG. 8 shows a simplified model of a two-dimensional structure 800. This simplified model will be used to explain the principles of the techniques disclosed herein, while it should be understood that those techniques become advantageous particularly when applied to much more complicated structures. The structure comprises a planar substrate layer 802 and periodic array of sub-structures 804 and 806. A repeating unit 810 is represented by a dashed rectangle. It is supposed that the sub-structures 804 and 806 are nominally identical. However, it is also supposed that, being manufactured by a double patterning process, they may different slightly in size, shape and/or position. Thus for example sub-structures 806 are shown taller than substructures 804. The repeating unit 810 is defined so as to include one of each type of sub-structure, so that these deviations can be identified in the simulated interactions and measured by reconstruction or other methods. The repeating unit may be typically defined so that it is symmetrical, and bisects the substructures 806, as shown. In the further drawings described below, this kind of detail is not shown, purely for ease of illustration.

Figure 9:
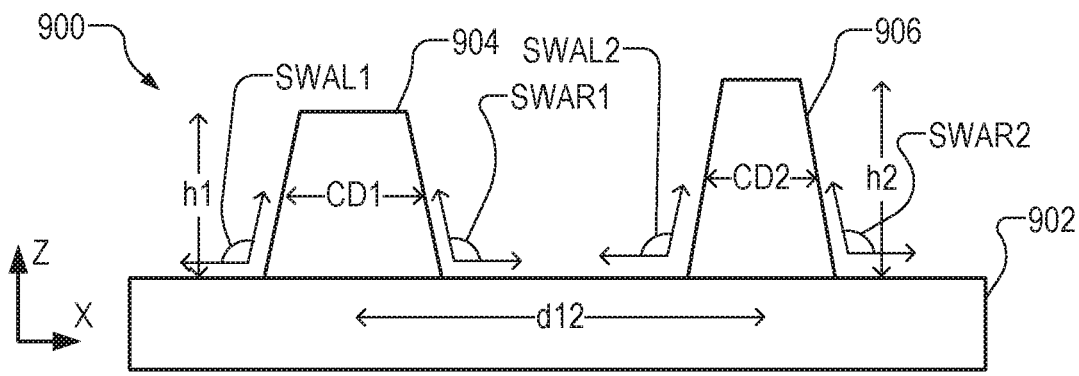
FIG. 9 illustrates parameters of the structure model of FIG. 8.

FIG. 9 illustrates a parameterized mathematical model 900 of the target structure 800 shown in FIG. 8. Only the repeating unit need be modeled explicitly, in a case where the target structure is periodic. Substrate layer 802 is represented by substrate model 902. First sub-structure 804 is represented by first sub-structure model 904 and second substructure 806 is represented by second sub-structure model 906. Each of these sub-structure models is defined by a set of dimension and shape parameters. Just for the sake of this example, the first sub-structure model is defined by a height h1, a width CD1, a left side wall angle SWAL1 and a right side wall angle SWAR1. The second sub-structure model is defined by corresponding parameters h2, CD2, SWAL2 and SWAR2. Each of these parameters can be considered as a (fixed or floating) parameter $p_i$ in the reconstruction method of FIG. 5. Another parameter d12 defines a distance between them. (As shown in FIG. 8, their arrangement may not be exactly equal.)

Because these parameters can be set independently for each sub-structure and for their relative arrangement, the model can represent the non-ideal performance of a double-patterning process. Consequently the scatterometry and reconstruction method can measure the non-ideal performance of the double-patterning process. A metrology and reconstruction recipe can be used to fix the parameter values, or to tie them together, to reduce complexity and computational burden. For example, by fixing SWAL1=SWAR1 and SWAL2=SWAR2, the calculations can be constrained to assume that the sub-structures are symmetrical within themselves. By fixing SWAL1=SWAR2 and SWAL2=SWAR1, the calculations can be constrained to assume that each gap or trench between sub-structures is symmetrical. The validity of these constraints can be predicted from prior knowledge (e.g. SEM images) and/or established by trial and error.

Any of the parameters can be expressed directly in the form shown, or in a different but equivalent form. For example, it may be convenient to express any of the parameters in the form of a deviation or "delta" from some nominal value, or relative to another parameter. For example height parameters h1 and h2 may be expressed in the form of an average height and a delta that expresses (for example) height h2 as a proportion of height h1. The scope of the present disclosure and of this example is not limited to any particular expression of the parameters.

Recall that each set of parameter values for a given model represents a point in a "parameter space", which is a mathematical space with as many dimensions as there are parameters in the model. The illustration in FIG. 9 corresponds to a region of parameter space where parameter h2 is greater than parameter h1. That is to say, if the model 900 corresponds to a real structure 800, the sub-structures 806 will be taller than sub-structures 804 by some amount. In another region of parameter space where h1 is greater than h2, the opposite will be true. In the course of the iterative reconstruction process of FIG. 5, the model can cross between these regions. Similarly, when populating a database with simulated spectra to provide a library of spectra, the model will cross between regions.

Figures 10A, 10B:
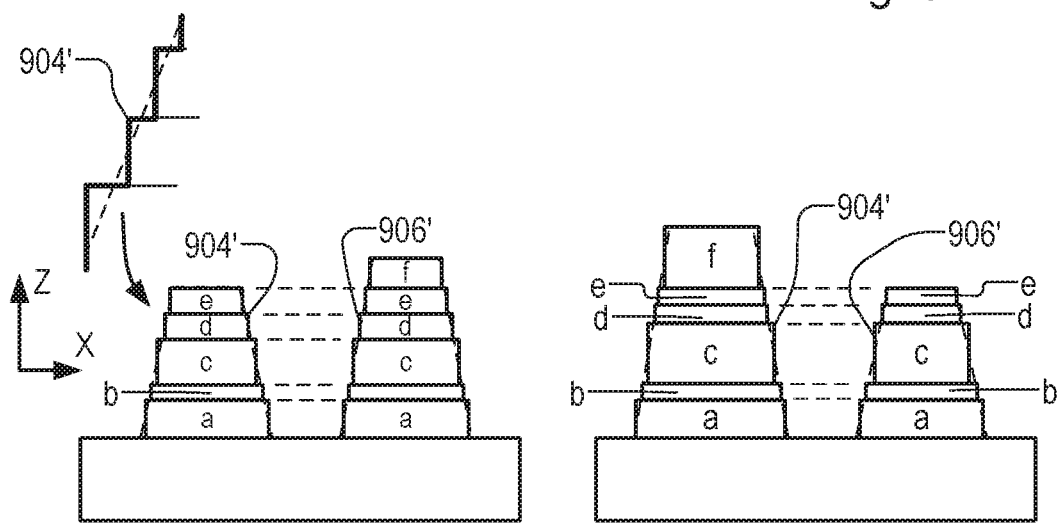
FIGS. 10A-10B illustrate slicing of the model of FIGS. 8 and 9 using a known technique in different situations (a) and (b)

FIG. 10 illustrates slicing of the mathematical model of FIG. 9 by known techniques, in these two regions of the parameter space. In each case, the sloping sides of each sub-structure are represented by a series of steps caused by the slicing mentioned above. In the inset detail of FIG. 10(a) it is shown how the steps create a staircase profile 904' that approximates the true sloping profile of sub-structure model 904. Similarly every sloping (or curved) edge or face is approximated by a series of steps. In this example, the slicing is performed by dividing the model space along the Z direction. With each slice, the approximated slope makes a step in the X direction. Similarly, if the sub-structure has a sloping side in the Y direction (not illustrated), each slice makes a step in the Y direction. In general, therefore, it will be seen that slicing is performed along at least a first dimension, and the approximated slope makes a step in a second dimension. When the first dimension is the Z direction in the illustrated example, the extent of the slice in the first dimension corresponds to the height of a feature. As mentioned already, the choice of the model space coordinate system and the first dimension can be adapted to particular circumstances. As will be illustrated below, slicing can be performed in more than one dimension, if desired.

FIG. 10(a) corresponds to the region in which h2>h1. The division of the model into slices has to extend across all sub-structures, so that the complete cross-section of the structure model is the same for all Z values in the slice. Consequently, when h2>h1, substructure model 906' will occupy at least one slice that is not occupied by sub-structure model 904'. Labeling the slices a, b, c, etc. for the same of illustration, sub-structure model 904' is divided into five slices a to e. Substructure model 906' is divided into the same five slices, plus an additional slice f. Similarly, when h1>h2, the situation shown at FIG. 10(b) applies. In this situation, it is the first substructure model 904' that is divided into (for example) six slices a to f, while the substructure model 906' is divided into only five slices.

Different slicing strategies are known for updating the model between iterations. In a simple strategy, the number of slices in the model is simply fixed (static). In more sophisticated strategies, the number of slices is determined dynamically according to some criterion. For example, the number of slices might be varied automatically according to the height and/or side wall angle, so as to limit any deviation between the 'real' slope and the staircase approximation necessitated by the series of steps. However, as illustrated by FIGS. 10(a) and (b), the substructures 904 and 906 require different numbers of slices if they are to have different heights, and the simple static slicing strategy cannot be applied.

Whichever of the known strategies is applied, it will be noted that the number of steps used to approximate a given sloping edge or face may vary as the model moves through the parameter space. This is true for structures in general, unless a fixed slicing strategy is used. Even if a fixed slicing strategy would be preferred, this cannot be applied in cases where relative heights of different substructures might vary over the parameter space, as illustrated in FIGS. 9 and 10.

Problem and Analysis

Figure 11:
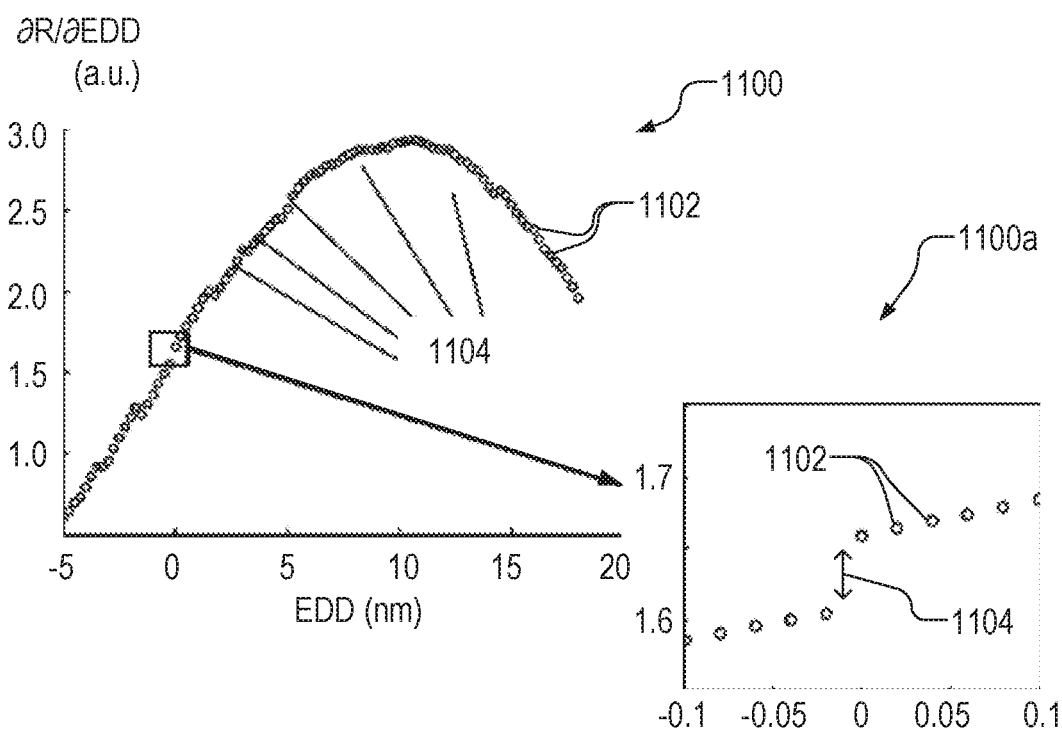
FIGS. 11 and 12 illustrate discontinuities in derivatives used in the reconstruction method of FIG. 5 using the known slicing methods for the structure of FIG. 2.

FIG. 11 illustrates a phenomenon that arises as a result of these changes in the numbers of steps used to approximate a given sub-structure in different parts of the parameter space. The graph 1100 represents variation of a partial derivative calculated in one implementation of the reconstruction process of FIG. 5. For each region or pixel of the diffraction pattern detected in the scatterometer, and for each wavelength used, simulated intensity can be plotted for any point in parameter space. Partial derivatives of these pixel values with respect to each parameter can be calculated at a point in parameter space, to obtain guidance which way to vary that parameter to maximize a merit function. FIG. 11 shows one such derivative, plotted as circles 1102 against a parameter. The parameter varying along the horizontal axis may be for example etch depth difference (EDD), representing the mismatch between the depths of the two trenches in a model of the structure shown in FIG. 2. The plot of derivatives has a generally smooth curved shape, but small discontinuities 1104 in the curve are visible. In the inset detail 1100a, one of these discontinuities is shown at enlarged scale. In general, the discontinuities can be seen as jumps in either the same direction or the opposite direction as the trend of the graph.

The present inventors have recognized (i) that these discontinuities can disrupt the iterative process so that the model fails to converge and (ii) the root cause of these discontinuities is the change in the number of steps that occurs between different regions of the parameter space, due to dynamic slicing. Bear in mind that the realistic structure of FIG. 2 is more complicated than the simplified structure of FIG. 8. It has pairs of upper and lower sub-structures stacked on top of one another, and within each pair, potentially which is the taller sub-structure changes from situation to situation. Accordingly, in a real target structure and structure model there may be many transitions between different regions of parameter space. This is why the curve of FIG. 11 has more than one discontinuity. Not all reconstruction processes use derivatives, but the underlying issue remains. These jumps in the derivatives correspond to kinks in the signal, that are an artifact of the slicing, and not a true reflection of the interaction of radiation with a real structure. They may correspond also to kinks or discontinuities in the merit function or cost function.

Figure 12:
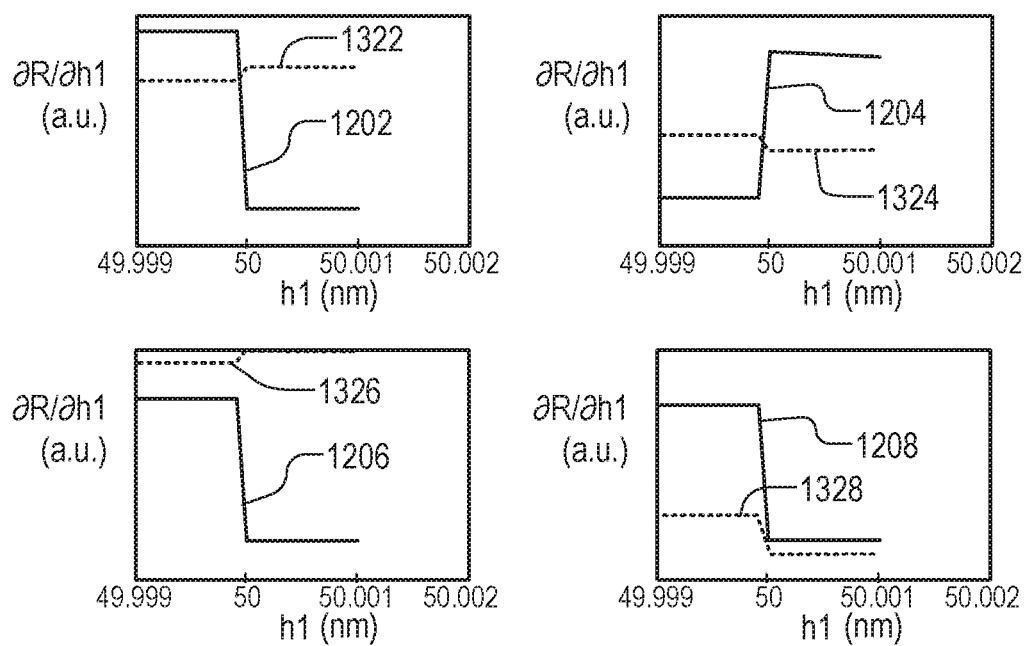
Figure 13A:
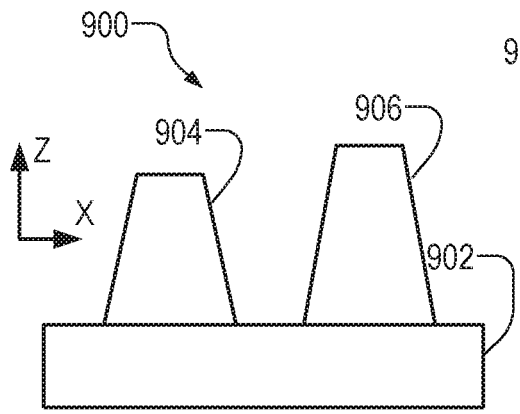
FIGS. 13A-13F illustrate slicing of the model of FIGS. 8 and 9 in situations (a) and (b) using to a modified slicing technique according to an embodiment of the present invention.
Figure 13B:
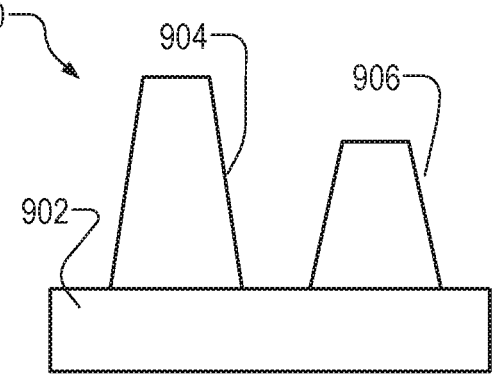
Figure 13C:
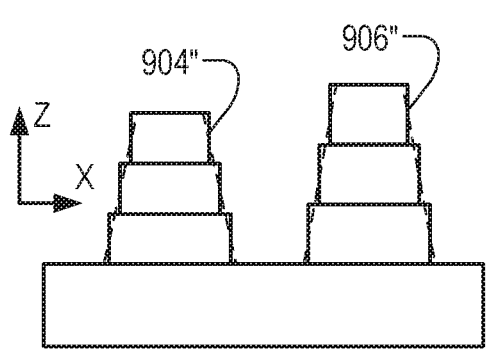
Figure 13D:
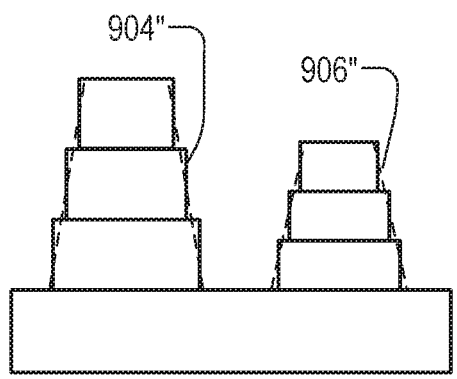
Figure 13E:
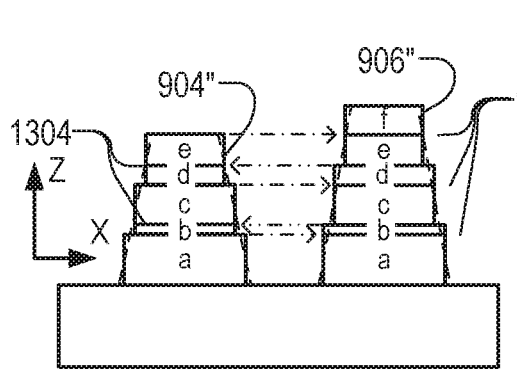
Figure 13F:
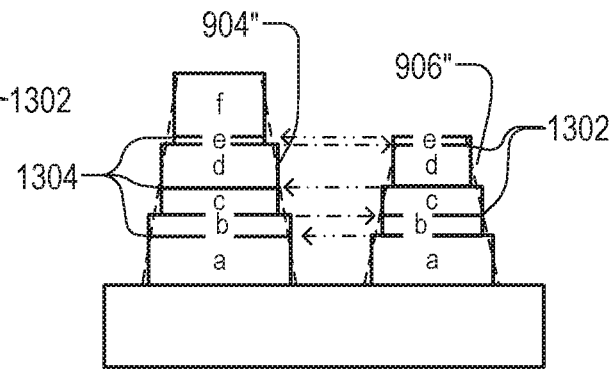
Figure 14A:
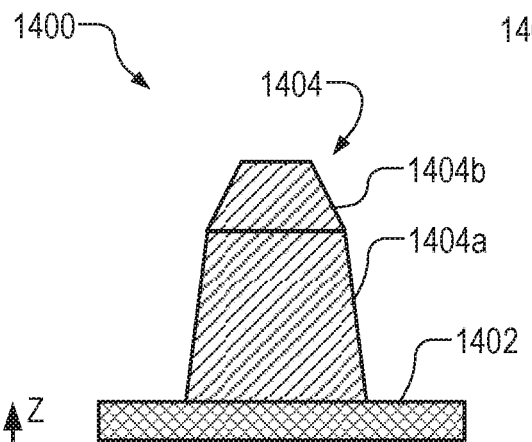
FIGS. 14A-14F and FIGS. 15A-FIG. 15D illustrate variations of slicing and shape approximation for different types of structures.
Figure 14B:
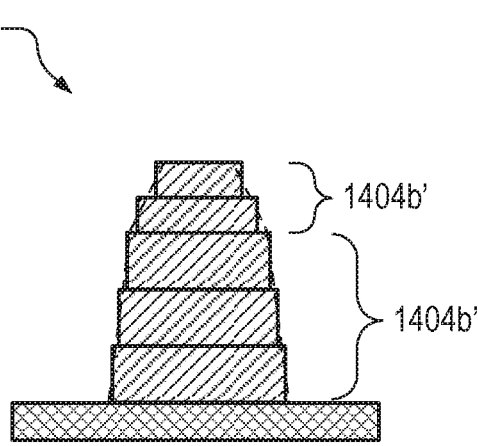
Figure 14C:
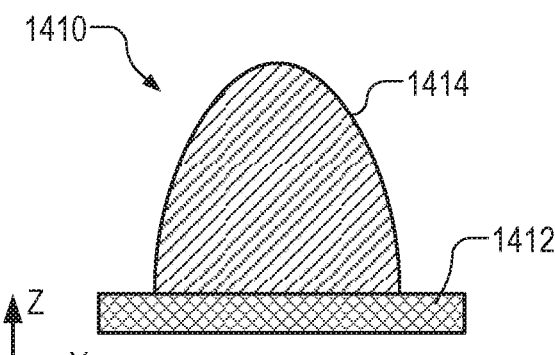
Figure 14D:
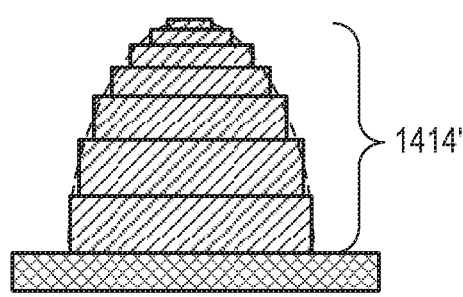
Figure 14E:
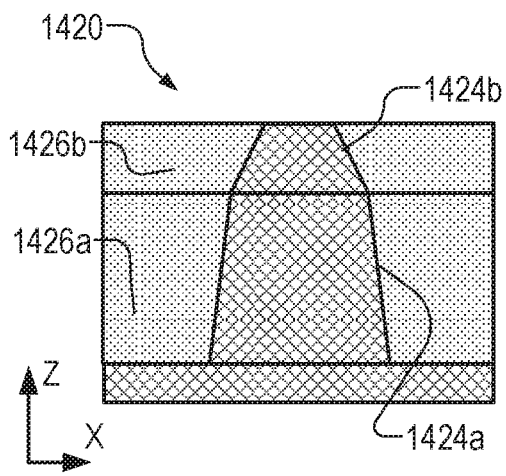
Figure 14F:
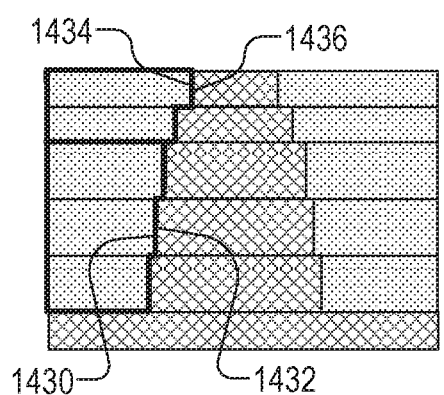

FIG. 12 illustrates discontinuities in the partial derivatives of some different exemplary reflectance components of the simulated scattered radiation for a simplified structure such as that illustrated in FIGS. 8 to 10. The vertical axis represents a derivative of reflectance relative to a height parameter (say, h1), on a logarithmic scale. The height parameter is represented on the horizontal axis in nanometers. In this example, the height value 50 nm is the value at which one sub-structure is as tall as the other (h2=50 nm). The solid line graphs 1202, 1204, 1206 and 1208 show the marked discontinuities in the derivative that arises when moving from the region h2>h1 to the region h1>h2. This is a result of the change in the numbers of steps which are used to approximate the two sub-structures' shapes 904 and 906 in the two situations shown at FIGS. 10(*a*) and (*b*).

Modified Slicing Strategy

FIG. 13 illustrates a modified slicing strategy that allows the discontinuities to be reduced by keeping the number of steps constant, which are used to approximate a sloping feature. The modified strategy also allows the number of slices to vary, however, so that it can accommodate the variety of situations arising in modern multiple-patterning processes and 3-D device structures.

FIG. 13 shows in cross-section the same simplified structure model 900 in the situations (a) (h2>h1) and (b) (h1>h2). FIGS. 13(*c*) and (*d*) show how a staircase approximation 904", 906" is defined for the sloping shape each sub-structure. The number of steps in the shape approximation for each slope is fixed and does not vary with variations in parameters such as height, width or side wall angle. The number of steps in all cases is 3 in this illustration. However, this is not important: the number of steps in the shape approximation need not be the same for all sub-structures, nor even for all sides of the same sub-structure.

Now, because the purpose of the slicing is to obtain slices in which the cross-section of the substrate does not vary with Z, each step implies that it is necessary to make a cut at the Z value of the step. However, under the modified slicing strategy, each cut between slices in the first dimension no longer implies necessarily a step in the shape profile in a second dimension. The number of slices can be increased or decreased independently of the number of steps (provided there is at least one cut per step).

FIGS. 13(*e*) and (*f*) illustrate the division of the structure models 904 and 906 into slices in the two situations, according to the modified method. The method involves simply defining a cut (a cut divides slices) wherever there is a step in the shape approximation of any of the sub-structures. This can involve the introduction of cuts in a substructure where there is no step in the shape approximation. Introducing these "necessary cuts" is performed as illustrated, but without introducing a new step in the shape as cut. Arrows from left to right (single dot-dash lines) indicate Z values at which a cut 1302 is introduced because of a step in the first sub-structure model 904". These cuts apply to the whole cross-section of the model and so a cut is introduced in the second sub-structure model 906" without introducing a step. Similarly, arrows from right to left (double dot-dash lines) show where the structure model 900 is cut is introduced because of a step in the second sub-structure model 906". A cut 1304 is introduced in the first sub-structure model 904" corresponding to each step in the second sub-structure model 906", but without introducing a step in the approximation of the shape of that sub-structure.

As in the prior example of FIG. 10, the different sub-structures are divided into either five slices (a to e) or six slices (a to f), depending on which one is the higher. By contrast with the prior example, however, the number of steps in the shape approximation of each sub-structure is independent of variation of the parameters. This decoupling of the number of slices from the number of steps in the shape approximation of each sub-structure allows the troublesome discontinuities to be greatly reduced.

Referring again to FIG. 12, dotted line graphs 1322, 1324, 1326, 1328 show how the magnitude of the discontinuities in the partial derivatives are greatly reduced using the modified strategy, compared with the strategy of FIG. 10. Smaller discontinuities remain, but this may be inevitable, when the sloping shape is approximated by a series of steps. There are also other approximations inherent in the implementation of the calculations. For example, polynomial calculations may be made with a certain number of orders (harmonics) only. Increasing the number of harmonics would reduce further the discontinuities, but the increased processing and storage burden may not be worthwhile.

FIG. 1414 illustrates some other cases that may be subjected to modified slicing in accordance with the principles described above. At (a) a structure model 1400 includes a substrate model 1402 and a sub-structure model 1404 for a sub-structure of a more complex shape than a simple trapezoid. The sub-structure model is represented in the mathematical model by two trapezoidal sub-structures 1404*a* and 1404*b* stacked on top of one another. In the corresponding model 1400', shown at (b), each trapezoidal sub-structure has its sloping sides is represented by its own series of steps labeled 1404*a*' and 1404*b*'. The shape of the sub-structure 1404 can be varied by varying independently the heights of the trapezoids, or they may be constrained to vary together. In either case, in this example the number of steps in each series is fixed throughout the parameter space, so that slices and steps do not become reassigned across the boundary between the two stacked shapes. In the simple example illustrated, the lower portion of the sub-structure 1404 is approximated by three steps, while the upper portion of the shape is approximated by two steps. (The examples presented herein are very simple ones, and more slices and more steps may be used in a real example, for example 5, 10 or 20 steps.)

While the example of FIGS. 14(*a*) and (*b*) concerns a sub-structure represented by stacked shapes of the same material, the same principle can be applied to a stack of sub-structures of different materials. Such a stack of sub-structures is seen for example in the structure of FIG. 2.

At (c) a structure model 1410 includes a substrate model 1402 and a sub-structure model 1414 for a sub-structure of a more complex shape than a simple trapezoid. The sub-structure model is represented in the mathematical model by a single shape having edges (or faces) curved in one or two dimensions. By a curved edge or face in this context, we mean a sloping edge or face with non-uniform slope. In the corresponding model 1400', shown at (d) the curved sub-structure has its sloping sides represented by a single series of steps labeled 1414' which decrease in height progressively towards the top of the shape. Although the steps are of different sizes, their relative sizes are fixed and can be varied with a height parameter, in the same way as the equal sized steps shown in the previous examples. In all these examples, we can say that the shape approximation remains fixed. The shape approximation remains fixed because not only the number of steps but their relative heights and widths remain fixed.

More generally, it is not necessary that the relative heights and widths remain fixed. In a different example, the relative heights could vary throughout the parameter space. Provided the steps vary smoothly when the parameters vary smoothly, the problems associated with discontinuities can be reduced.

At (e) a structure model 1420 includes a substrate model 1402 and a sub-structure model 1424 in two parts 1424a and 1424b similar to those in (a) above. Additionally, a filling material or coating is represented by a sub-structure 1426a having a common edge (or face) with sub-structure 1424a and a sub-structure 1426b having a common edge (or face) with sub-structure 1424b. As shown at (f), the slicing is performed so as to ensure that the shape approximation for the common edges is the same for both subs-structures. That is to say, the steps 1430 representing the edge of the filling or coating sub-structure 1426a are constrained to provide the same shape approximation as the steps 1432 representing the edge of sub-structure 1424a. The same applies to the upper shapes, in that the steps 1434 representing the edge of the filling or coating sub-structure 1426b are constrained to provide the same shape approximation as the steps 1436 representing the edge of sub-structure 1424b. In this way, there is no need to introduce additional slices to represent the filler or coating (unless extra slices are wanted), and there is no risk of gaps or overlap arising, between the materials of the different sub-structures. Again in this simple illustration, three steps are used for the lower shapes and two steps for the upper shapes.

FIG. 15 shows further examples with different curved faces and different shape approximations. At (a), first sub-structure having a concave profile 1502 is approximated by four steps 1504, while a second sub-structure 1506 is approximated by only three steps 1508. Necessary cuts are made as described above, for example at 1510.

Figure 15A:
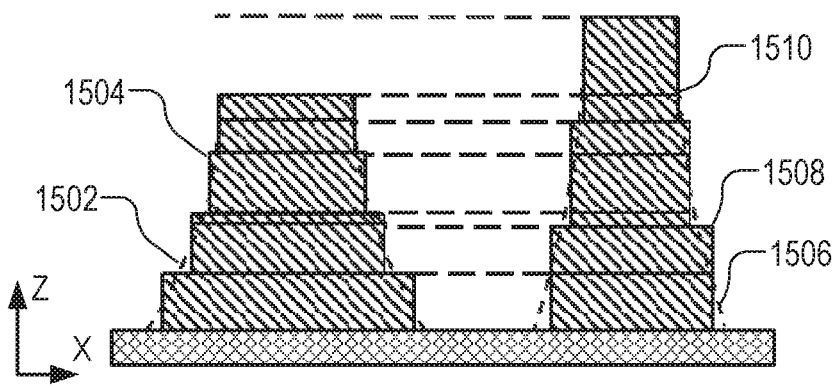
Figure 15B:
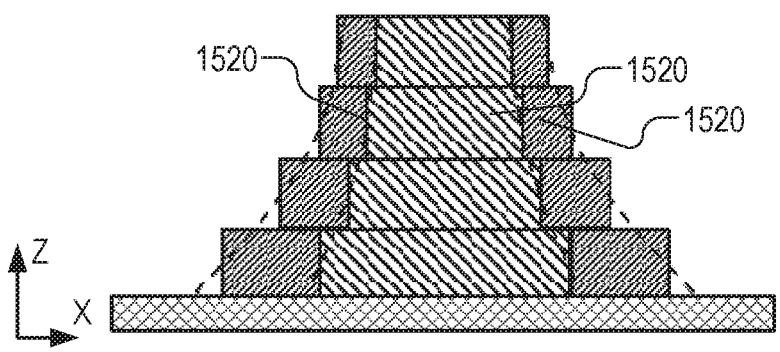

At FIG. 15(b) a conformal coating is modeled with a thickness that increases from top to bottom. As in FIG. 14(e), a face 1520 is common to an inner sub-structure 1522 and the coating substructure 1524. The series of steps used as the shape approximation for this common face is the same for both substructures. An outer face 1626 of the coating substructure is approximated with the same number of steps as the face 1520, in this example, although that is not necessarily the case.

Figure 15C:
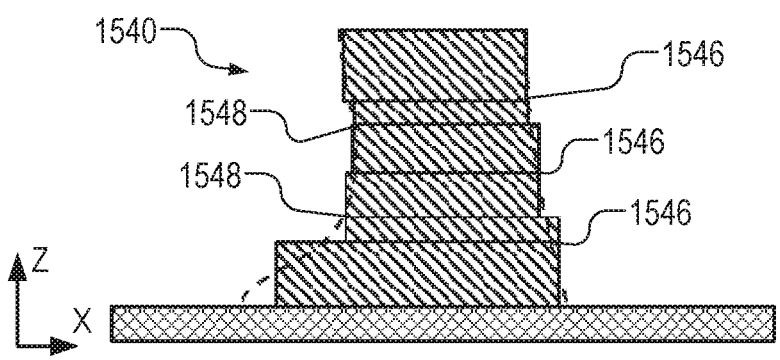

FIG. 15(c) shows a structure 1540 which is highly asymmetrical. A shape approximation for the right hand face, as shown, comprises three steps. Each of the three steps in this example is of equal extent in the height (Z) direction. A shape approximation for the face shown at the left hand side has four steps. Each of the four steps in this example is of equal extent in the height (Z) direction. In principle the shape approximations for the different faces can be very different, either or both of them could use steps of unequal extent. Note that necessary cuts are made across the sub-structure, wherever either of the faces has a step. These necessary cuts in the right hand face are labeled 1546, while those in the left hand face are labeled 1548.

Figure 15D:
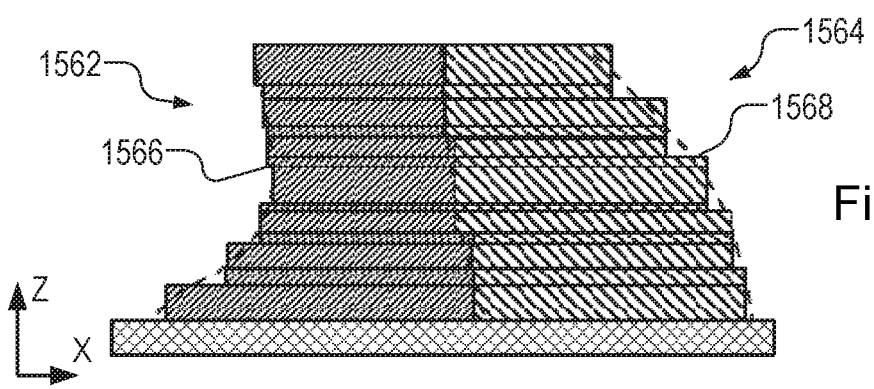

FIG. 15(d) shows a further example. In this example, two sub-structures 1562 and 1564 of different materials are formed against one another and in contact. A left hand face of the sub-structure 1566 is approximated with seven steps 1566. A right hand face of the sub-structure 1564 is approximated with five steps 1568. A common face between the sub-structures 1562 and 1564 is approximated with three steps. Necessary cuts are made across the sub-structure so that slices can be defined which are of constant cross-section along the slicing direction (Z).

As in all the examples, the same necessary cuts are made across the model space and any other sub-structures that overlap in extent with the shown sub-structures. (Further cuts may be necessary in the structures shown, to correspond with steps in the other sub-structures not shown.)

Figure 16A:
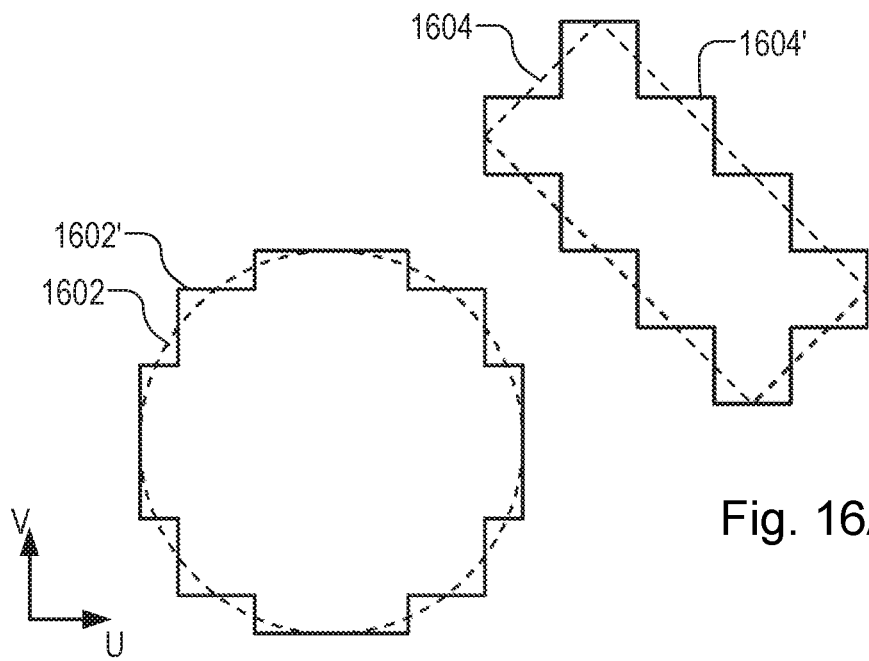
FIGS. 16A-16B illustrate slicing in more than one dimension.

FIG. 16 illustrates slicing in two dimensions, with fixed shape approximations and necessary cuts also in two dimensions. At (a) there are shown in outline a circular sub-structure 1602 and a rectangular or "brick" sub-structure 1604. Axes are shown but labeled U and V instead of X, Y or Z. This is to illustrate that the slicing direction is not limited to any particular direction, even in a Cartesian coordinate system. The view could be a plan view of a structure on a substrate, in which case the axes U and V might correspond to the conventional axes X, Y. The structure extends in a third dimension, not shown. The view could be a cross-section through a 3-dimensional structure on a substrate, in which case the axes U, V could be the X, Z axes or the Y, Z axes. The substructures 1602 and 1604 could for example be buried in a substrate. The structure may not be a semiconductor product at all, but any structure in a multi-dimensional space.

Figure 16B:
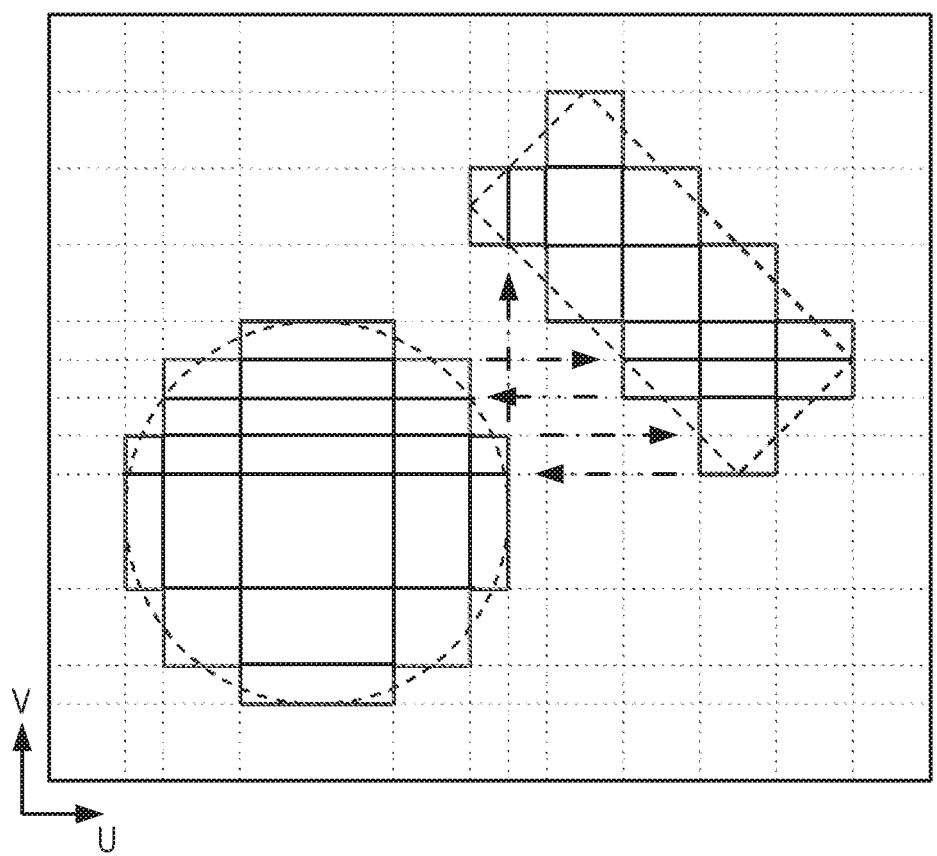

The sloping faces of the sub-structures 1602 and 1604 are approximated by series of steps 1602' and 1604' shown in solid lines. The sides of the steps are aligned with the U and V axes. As shown in FIG. 16(b), the structure model is sliced in both the U and V directions. Every step in both directions requires a cut. Necessary cuts from each shape to the other are shown by arrows in the drawing, similar to the arrows in FIGS. 13(e) and (f).

Figure 17:
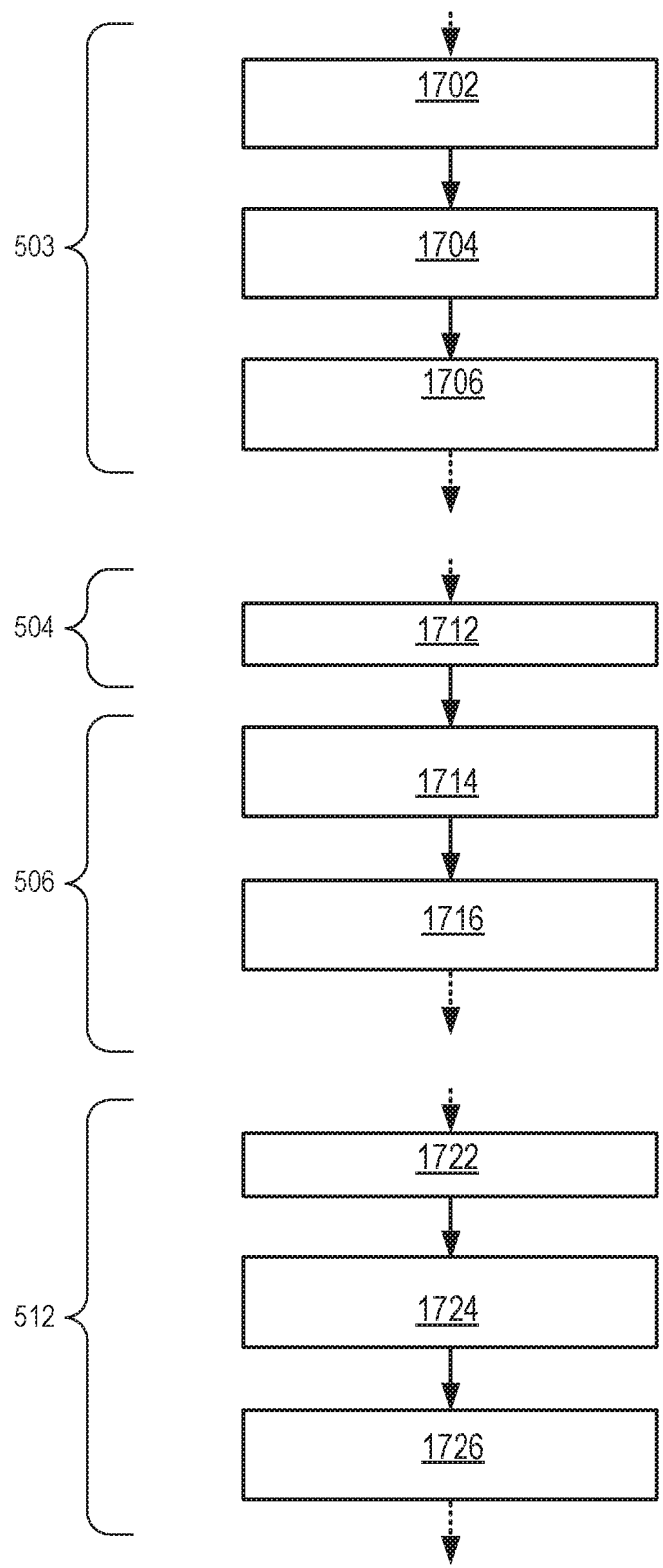
FIG. 17 illustrates in more detail steps of the method of FIG. 5, applying the modified slicing technique of FIGS. 13 to 16.

FIG. 17 shows how some steps within the example reconstruction method of FIG. 5 can be performed to implement the modified slicing methods disclosed herein. Recall that step 503 involves defining a model recipe. In the example of FIG. 17, this step comprises sub-steps: 1702 defining shapes of sub-structures in a structure model; 1704 defining shape approximations, fixing a number of steps per edge or face of a shape; 1706 defining a phase reference, as illustrated in FIG. 15. The steps 1704 and 1706 are shown as sequential steps within step 503, but they may be performed in a different sequence, for example, after step 1712 below.

Recall that step 504 comprises setting initial values $p_i(0)$ for the floating parameters (i.e. $p_1(0)$, $p_2(0)$, $p_3(0)$ and so on). In the example of FIG. 17 this step includes step 1712 estimating parameters for the initial shapes. Then as a precursor calculating the scattering properties, slicing is determined. This comprises: 1714 defining slices necessary to implement the steps of the shape approximations defined in steps 1704, 1706; and 1716 making any cuts necessary to implement the steps of all shape approximations across a slice (see FIGS. 13(e) and (f), described above). The steps 1714 and 1716 are shown as sequential steps, but they may be performed in an integrated manner or in an iterative manner without departing from the principles explained.

In step 512, revised parameters are calculated, to try and make the reconstructed diffraction spectrum closer to an observed spectrum. The comprises the sub-steps: 1722 defining revised parameters as already explained above in relation to step 512; 1724 revising the slicing to implement series of steps representing sloping edges and faces having the revised parameters, while keeping shape approximations constant; 1726 adding and/or deleting necessary cuts to other shapes without adding or deleting steps in the shape approximations. In principle, one does not need to delete cuts. However, to process two slices having the same cross-section on top of one another would be wasteful of computing resources, so such slices should be merged into one slice.

Figure 18:
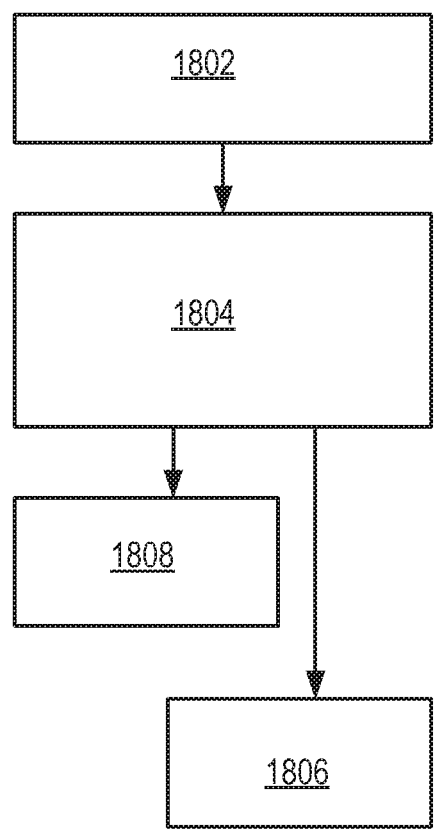
FIG. 18 illustrates methods of controlling a lithographic process using measurements made by the reconstruction technique of FIG. 5.

FIG. 18 illustrates a general method of controlling a lithographic manufacturing facility such as the one shown in FIG. 1, using the modified reconstruction methods described above. At 1802, a substrate is processed in the facility to produce one or more structures on a substrate such as a semiconductor wafer. The structures may be distributed at different locations across the wafer. The structures may be parts of functional devices, or they may be dedicated metrology targets. At 1804 the method of FIG. 5 (with modified slicing as disclosed herein) is used to measure properties of the structures at locations across the wafer. At 1806 recipes for controlling the lithographic apparatus and/or other processing apparatuses are updated based on the measurements reported in step 1804. For example, the updates may be designed to correct deviations from ideal performance, identified by the reconstruction. Performance parameters may be any parameter of interest. Typical parameters of interest might be, for example, linewidth (CD), overlay, CD uniformity and the like.

At 1808, optionally, the recipe for performing the measurement on future substrates may be revised based on findings in step 1804 or from elsewhere. As an example of metrology recipe parameters that may be updated, the shape approximation for a given sub-structure could be revised to increase the number of steps. Other examples will be apparent to the skilled reader from their understanding of the present disclosure.

CONCLUSIONS

In conclusion, the present disclosure provides modified techniques for use in reconstruction type metrology, and other applications where it is useful to be able to simulate interaction with a parameterized model of a structure. In particular for complex structures, the methods disclosed herein reduce the problem of poor convergence caused by changes in shape approximations over a parameter space.

An embodiment of the invention may be implemented using a computer program containing one or more sequences of machine-readable instructions describing methods of controlling the lithographic apparatus using height map data as described above. This computer program may be executed for example within the control unit LACU 206 of FIG. 1, the metrology apparatus 240, the supervisory control system 238 or some other controller. There may also be provided a data storage medium (e.g., semiconductor memory, magnetic or optical disk) having such a computer program stored therein. The storage may be of non-transitory type.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The terms "radiation" and "beam" used herein further encompass other forms of radiation including acoustic (sound) radiation. Phenomena of scattering and diffraction arise also in sound, and similar calculations can be performed for reconstruction of unknown structures by acoustic scattering.

The term "lens", where the context allows, may refer to any one or combination of various types of optical components, including refractive, reflective, magnetic, electromagnetic and electrostatic optical components.

The breadth and scope of the present invention should not be limited by any of the above-described exemplary embodiments, but should be defined only in accordance with the following claims and their equivalents.

The invention claimed is:

1. A method of metrology in a metrology apparatus for determining parameters of a structure, the structure formed using a lithographic process of a lithographic system and comprising a plurality of sub-structures, the method comprising:
   defining a structure model to represent the structure in a two- or three-dimensional model space;
   using the structure model to simulate interaction of radiation with the structure; and
   repeating using the structure model while varying parameters of the structure model,
   wherein for using the structure model, dividing the structure model into a series of slices along at least a first dimension of the model space,
   wherein, by the dividing, a sloping face of at least one sub-structure is approximated by a series of steps along at least a second dimension of the model space,
   wherein a number of the series of steps approximating the sloping face is maintained constant between repeats of using the structure model while a number of the series of slices varies three or more times,
   wherein the structure model defines:
      a first sub-structure whose extent in the first dimension depends on a first parameter, the first sub-structure having a first sloping face approximated by a first series of steps in the second dimension, a number of steps in the first series of steps being constant between the repeats of using the structure model, and
      a second sub-structure whose extent in the first dimension depends on a second parameter, the second sub-structure having a second sloping face approximated by a second series of steps in the second dimension a number of steps in the second series of steps being constant between the repeats of using the structure model,
   wherein the dividing the structure model into the series of slices that are continuous across the first and second sub-structures comprises introducing a cut in the second sub-structure to match a step in the first sub-structure without introducing a step in the approximated second sloping face, and
   wherein the determined parameters are configured to be used for controlling the lithographic system.

2. The method as claimed in claim 1, wherein the dividing the structure model into the series of slices that are continuous across the first and second sub-structures comprises introducing a cut in the first sub-structure to match a step in the second sub-structure without introducing a step in the approximated first sloping face.

3. The method as claimed in claim 1, wherein the structure model defines:
   a lower sub-structure for the first sub-structure having a sloping face approximated by a lower series of steps, a number of steps in the lower series of steps being constant between the repeats of using the structure model; and
   an upper sub-structure for the first sub-structure having a sloping face approximated by an upper series of steps, a number of steps in the upper series of steps being constant between the repeats of using the structure model.

4. The method as claimed in claim 1, wherein within each of the series of steps an extent of each step in the first dimension varies with variation of the parameters in the repeating step.

5. The method as claimed in claim 1, wherein at least one series of steps comprises two or more steps of equal extent in the first dimension, extents of the steps remaining equal during performance of the method.

6. The method as claimed in claim 1, wherein at least one series of steps comprises two or more steps of different extents in the first dimension, the extents of the steps remaining in constant ratio during performance of the method.

7. The method as claimed in claim 1, wherein the repeating using the structure model comprises:
    comparing the interaction simulated using the structure model with a real interaction observed in a metrology apparatus with the structure;
    varying one or more parameters of the structure model based on the comparison; and
    repeating using the structure model using the varied parameters, and
    wherein the method further comprises:
        after a number of iterations of the repeating using the structure model, reporting parameters of the structure model as a measurement of the parameters of the structure.

8. The method as claimed in claim 7, wherein the metrology apparatus comprises an angle-resolved spectrometer and wherein the comparing the interaction simulated using the structure model comprises generating a simulated scatter spectrum of the structure.

9. A processing apparatus for use in a metrology apparatus in determining parameters of a structure, the structure formed using a lithographic process of a lithographic system and comprising a plurality of sub-structures, the apparatus comprising:
    a processor configured to:
        define a structure model to represent the structure in a two- or three-dimensional model space;
        use the structure model to simulate interaction of radiation with the structure; and
        repeat using the structure model while varying parameters of the structure model,
        wherein for using the structure model, the processor is configured to divide the structure model into a series of slices along at least a first dimension of the model space,
        wherein, by the dividing, a sloping face of at least one sub-structure is approximated by a series of steps along at least a second dimension of the model space,
        wherein the processor is further configured to maintain a number of the series of steps approximating the sloping face constant between repeats of using the structure model while a number of the series of slices varies,
        wherein at least one series of steps comprises two or more steps of different extents in the first dimension, the extents of the steps remaining in constant ratio to one another while varying in extent between repeats of using the structure model, and
        wherein the determined parameters are configured to be used for controlling the lithographic system.

10. The apparatus as claimed in claim 9, wherein the structure model defines:
    a first sub-structure whose extent in the first dimension depends on a first parameter, the first sub-structure having a first sloping face approximated by a first series of steps in the second dimension, a number of steps in the first series of steps being constant between the repeats of using the structure model; and
    a second sub-structure whose extent in the first dimension depends on a second parameter, the second sub-structure having a second sloping face approximated by a second series of steps in the second dimension, a number of steps in the second series of steps being constant between the repeats of using the structure model.

11. The apparatus as claimed in claim 10, wherein to divide the structure model into the series of slices that are continuous across the first and second sub-structures, the processor is configured to introduce a cut in the second sub-structure if necessary to match a step in the first sub-structure without introducing a step in the approximated second sloping face.

12. The apparatus as claimed in claim 11, wherein to divide the structure model into the series of slices that are continuous across the first and second sub-structures, the processor is configured to introduce a cut in the first sub-structure if necessary to match a step in the second sub-structure without introducing a step in the approximated first sloping face.

13. The apparatus as claimed in claim 9, wherein the structure model defines:
    a lower sub-structure having a sloping face approximated by a lower series of steps; a number of steps in the lower series of steps being constant between the repeats of using the structure model; and
    an upper sub-structure having a sloping face approximated by an upper series of steps, the number of steps in the upper series of steps being constant between the repeats of using the structure model.

14. The apparatus as claimed in claim 9, wherein within each series of steps the processor is configured to vary an extent of each step in the first dimension with variation of the parameters during the repeat.

15. The apparatus as claimed in claim 9, wherein for the repeating using the structure model the processor is configured to:
    compare the interaction simulated using the structure model with a real interaction observed in a metrology apparatus with the structure;
    vary one or more parameters of the structure model based on the comparison; and
    repeat using the structure model using the varied parameters, and
    wherein the processor is further configured to:
        after a number of iterations of the repeating using the structure model, report parameters of the structure model as a measurement of the parameters of a target structure.

16. A metrology apparatus for use in determining parameters of a structure, the metrology apparatus comprising:
    an irradiation system configured to generate a beam of radiation;
    a substrate support operable with the irradiation system for irradiating the structure including a plurality of sub-structures, the structure formed using a lithographic process of a lithographic system on the substrate with the beam of radiation;
    a detection system configured to detect radiation after interaction with the structure; and
    a processing apparatus for use in determining the parameters of the structure comprising:
        a processor configured to:
            define a structure model to represent the structure in a two- or three-dimensional model space;
            use the structure model to simulate interaction of radiation with the structure;

repeat using the structure model while varying parameters of the structure model, wherein for using the structure model, the processor is configured to divide the structure model into a series of slices along at least a first dimension of the model space, and wherein, by the dividing, a sloping face of at least one sub-structure is approximated by a series of steps along at least a second dimension of the model space, and maintain a number of the series of steps approximating the sloping face constant between repeats of using the structure model while a number of the series of slices varies three or more times, wherein the structure model defines:

a first sub-structure whose extent in the first dimension depends on a first parameter, the first sub-structure having a first sloping face approximated by a first series of steps in the second dimension, a number of steps in the first series of steps being constant between the repeats of using the structure model, and a second sub-structure whose extent in the first dimension depends on a second parameter, the second sub-structure having a second sloping face approximated by a second series of steps in the second dimension, a number of steps in the second series of steps being constant between the repeats of using the structure model, wherein the dividing the structure model into the series of slices that are continuous across the first and second sub-structures comprises introducing a cut in the second sub-structure to match a step in the first sub-structure without introducing a step in the approximated second sloping face, and wherein the determined parameters are configured to be used for controlling the lithographic system.

17. The metrology apparatus as claimed in claim 16, wherein the metrology apparatus comprises an angle-resolved spectrometer and wherein the processing apparatus is further configured to generate a simulated scatter spectrum of the structure.

18. A device manufacturing method comprising:

transferring a pattern from a patterning device onto a substrate using a lithographic process of a lithographic system, the pattern defining at least one structure including a plurality of sub-structures;

measuring, using a metrology apparatus, one or more properties of the structure to determine a value for one or more parameters of the lithographic process; and applying a correction in subsequent operations of the lithographic process in accordance with the measured one or more properties, wherein the measuring the one or more properties of the structure includes determining a property by a method comprising:

defining a structure model to represent the structure in a two- or three-dimensional model space;

using the structure model to simulate interaction of radiation with the structure; and repeating using the structure model while varying parameters of the structure model, wherein for using the structure model, dividing the structure model into a series of slices along at least a first dimension of the model space, wherein, by the dividing, a sloping face of at least one sub-structure is approximated by a series of steps along at least a second dimension of the model space, wherein a number of the series of steps approximating the sloping face is maintained constant between repeats of using the structure model while a number of slices varies, wherein the structure model defines:

a first sub-structure whose extent in the first dimension depends on a first parameter, the first sub-structure having a first sloping face approximated by a first series of steps in the second dimension, a number of steps in the first series of steps being constant between the repeats of using the structure model, and a second sub-structure whose extent in the first dimension depends on a second parameter, the second sub-structure having a second sloping face approximated by a second series of steps in the second dimension, a number of steps in the second series of steps being constant between the repeats of using the structure model, and wherein the dividing the structure model into the series of slices that are continuous across the first and second sub-structures comprises introducing a cut in the second sub-structure to match a step in the first sub-structure without introducing a step in the approximated second sloping face.

19. A lithographic system comprising:

an illumination system configured to condition a radiation beam;

a support configured to support a patterning device, the patterning device capable of imparting the radiation beam with a pattern in its cross section to form a patterned radiation beam;

a substrate table constructed to hold a substrate;

a projection system configured to project the patterned radiation beam onto a target portion of the substrate; and a metrology apparatus for use in determining parameters of a structure, the metrology apparatus comprising:

an irradiation system configured to generate a beam of radiation;

a substrate support operable with the irradiation system for irradiating the structure including a plurality of sub-structures, the structure formed on the substrate with radiation;

a detection system configured to detect radiation alter interaction with the structure; and a processing apparatus for use in determining parameters of the structure comprising:

a processor configured to:

define a structure model to represent the structure in a two- or three-dimensional model space;

use the structure model to simulate interaction of radiation with the structure;

repeat using the structure model while varying parameters of the structure model, wherein for using the structure model, the processor is configured to divide the structure model into a series of slices along at least a first dimension of the model space, and wherein, by the dividing, a sloping face of at least one sub-structure is approximated by a series of steps along at least a second dimension of the model space, and maintain a number of steps approximating the sloping face constant between repeats of using the structure model while a number of slices varies three or more times, wherein the structure model defines:
- a first sub-structure whose extent in the first dimension depends on a first parameter, the first sub-structure having a first sloping face approximated by a first series of steps in the second dimension, a number of steps in the first series of steps being constant between the repeats of using the structure model, and
- a second sub-structure whose extent in the first dimension depends on a second parameter, the second sub-structure having a second sloping face approximated by a second series of steps in the second dimension, a number of steps in the second series of steps being constant between the repeats of using the structure model, wherein the dividing the structure model into the series of slices that are continuous across the first and second sub-structures comprises introducing a cut in the second sub-structure to match a step in the first sub-structure without introducing a step in the approximated second sloping face.

20. A non-transitory tangible computer program product comprising machine readable instructions for causing a processor to perform a method of metrology in a metrology apparatus for determining parameters of a structure on a substrate, the structure formed using a lithographic process of a lithographic system and comprising a plurality of sub-structures, the method comprising:

defining a structure model to represent the structure in a two- or three-dimensional model space;

using the structure model to simulate interaction of radiation with the structure; and repeating using the structure model while varying parameters of the structure model, wherein for using the structure model, dividing the structure model into a series of slices along at least a first dimension of the model space, wherein, by the dividing, a sloping face of at least one sub-structure is approximated by a series of steps along at least a second dimension of the model space, wherein a number of the series of steps approximating the sloping face is maintained constant between repeats of using the structure model while a number of the series of slices varies, wherein at least one series of steps comprises two or more steps of different extents in the first dimension, the extents of the steps remaining in constant ratio during repeating using the structure model, and wherein the determined parameters are configured to be used for controlling the lithographic system.

* * * * *

UNITED STATES PATENT AND TRADEMARK OFFICE
CERTIFICATE OF CORRECTION

PATENT NO. : 10,592,618 B2
APPLICATION NO. : 15/209290
DATED : March 17, 2020
INVENTOR(S) : Dirks et al.

Page 1 of 1

It is certified that error appears in the above-identified patent and that said Letters Patent is hereby corrected as shown below:

In the Claims

In Column 22, Lines 32-33, replace "a second series of steps in the second dimension a number of steps in the second series of steps" with --a second series of steps in the second dimension, a number of steps in the second series of steps--.

Signed and Sealed this
Fifth Day of May, 2020

Andrei Iancu
*Director of the United States Patent and Trademark Office*